(12) United States Patent
Babin et al.

(10) Patent No.: US 10,738,599 B2
(45) Date of Patent: Aug. 11, 2020

(54) SYSTEM AND TOOL WITH INCREASED FORECAST ACCURACY TO CONFIGURE WELL SETTINGS IN MATURE OIL FIELDS

(71) Applicants: International Business Machines Corporation, Armonk, NY (US); LLC "GAZPROMNEFT SCIENCE & TECHNOLOGY CENTRE", Saint-Petersburg (RU)

(72) Inventors: Vladimir M. Babin, Saint-Petersburg (RU); David Echeverria Ciaurri, New York, NY (US); Maria Golitsyna, Moscow (RU); David Kremer Garcia, Madrid (ES); Artyom Semenikhin, Moscow (RU); Oleg S. Ushmaev, Moscow (RU); Ramil R. Yaubatyrov, Saint-Petersburg (RU)

(73) Assignees: International Business Machines Corporation, Armonk, NY (US); LLC "Gazpromneft Science & Technology Centre", Saint-Petersburg (RU)

( * ) Notice: Subject to any disclaimer, the term of this patent is extended or adjusted under 35 U.S.C. 154(b) by 533 days.

(21) Appl. No.: 15/632,761

(22) Filed: Jun. 26, 2017

(65) Prior Publication Data
US 2018/0258761 A1    Sep. 13, 2018

(30) Foreign Application Priority Data

Mar. 10, 2017 (EP) ..................................... 17382122

(51) Int. Cl.
*E21B 49/00* (2006.01)
*E21B 41/00* (2006.01)
*G06F 30/20* (2020.01)

(52) U.S. Cl.
CPC ............ *E21B 49/003* (2013.01); *E21B 41/00* (2013.01); *G06F 30/20* (2020.01)

(58) Field of Classification Search
None
See application file for complete search history.

(56) References Cited

U.S. PATENT DOCUMENTS

| 6,519,531 B1 | 2/2003 | Batycky et al. |
| 2008/0082469 A1* | 4/2008 | Wilkinson ............... E21B 43/00 706/13 |

(Continued)

OTHER PUBLICATIONS

Echeverria Ciaurri D. et al., "Application of Derivative-Free Methodologies to Generally Constrained Oil Production Optimization Problems", 2012, Procedia Computer Science 1, Elsevier Ltd. (Year: 2012).*

(Continued)

*Primary Examiner* — Cedric Johnson
(74) *Attorney, Agent, or Firm* — Scully, Scott, Murphy & Presser, P.C.; Kristofer L. Haggerty, Esq.

(57) ABSTRACT

Well settings in mature oil field may be configured by generating progressively, geological reservoir models by fitting a set of initial geological reservoir models that generate forecasts of fluid injection and production at a well as a function of time, with a subset of historical well data to produce a set of intermediary geological reservoir models, and fitting the set of intermediary geological reservoir models to a next subset of the historical well data. A set of diverse geological reservoir models may be determined from the geological reservoir models. A mid-term schedule of well settings associated with the well may be generated based on the set of diverse geological reservoir models and an economic model that comprises mid-term estimation of oil sale price and of production costs. The mid-term sched- (Continued)

ule of well settings may be actuated to control the fluid injection and production at the well.

20 Claims, 22 Drawing Sheets

(56) References Cited

U.S. PATENT DOCUMENTS

2008/0091283 A1* 4/2008 Balci ................. G06Q 10/06 700/90
2009/0157590 A1* 6/2009 Mijares ................. E21B 43/00 706/61

OTHER PUBLICATIONS

Lorentzen, Rolf J. et al., "History Matching Channelized Reservoirs Using the Ensemble Kalman Filter", Mar. 2012, SPE Journal. (Year: 2012).*

Awasthi, Ankur et al., "Meeting the Challenges of Real-Time Production Optimization—A Parametric Model-Based Approach", Feb. 25-27, 2008, SPE Intelligent Energy Conference and Exhibition, Society of Petroleum Engineers. (Year: 2008).*

Echeverria Ciaurri, D., et al., "Application of derivative-free methodologies to generally constrained oil production optimisation problems", International Journal of Mathematical Modelling and Numerical Optimisation, 2011 (Month Unknown), pp. 134-161, vol. 2, No. 2.

Sarma, P., et al., "Production Optimization With Adjoint Models Under Nonlinear Control-State Path Inequality Constraints", SPE Reservoir Evaluation and Engineering, Apr. 2008, pp. 326-339.

Voznyuk, A.S., et al., "Multi-Criteria Analysis and Optimization of Waterflood Systems in Brownfields", SPE International, SPE Russian Oil and Gas Exploration and Production Technical Conference and Exhibition, Oct. 2014, pp. 1-15.

Caers, J., et al., "The Probability Perturbation Method: A New Look at Bayesian Inverse Modeling", Mathematical Geology, Jan. 2006, pp. 81-100, vol. 38, No. 1.

Cominelli, A ., "Using Gradients to Refine Parameterization in Field-Case History-Matching Projects", SPE Reservoir Evaluation & Engineering, Jun. 2007, pp. 233-240, vol. 10, No. 3.

Dadashpour, M., et al., "A derivative-free approach for the estimation of porosity and permeability using time-lapse seismic and production data", Journal of Geophysics and Engineering, (2010), pp. 351-368, Sep. 2010, vol. 7, No. 4.

Jin, L., et al., "A Comparison of Stochastic Data-Integration Algorithms for the Joint History Matching of Production and Time-Lapse-Seismic Data", SPE Reservoir Evaluation & Engineering, Aug. 2012, pp. 498-512, vol. 15, No. 4.

Awotunde, A.A., "A multiresolution adjoint sensitivity analysis of time-lapse saturation maps", Computational Geosciences, May 2014, pp. 677-696, vol. 18, No. 5.

Lorentzen, R.J., et al., "History Matching Channelized Reservoirs Using the Ensemble Kalman Filter", SPE Journal, Mar. 2012, pp. 137-151, vol. 17, No. 1.

Basu, S., et al., "Multi-Start Method for Reservoir Model Uncertainty Quantification with Application to Robust Decision-Making", International Petroleum Technology Conference, Nov. 14-16, 2016, pp, 1-19, Paper IPTC 18711 MS.

* cited by examiner

SYSTEM AND TOOL WITH INCREASED FORECAST ACCURACY TO CONFIGURE WELL SETTINGS IN MATURE OIL FIELDS

FIELD

The present application relates generally to oil wells and generating and setting well configurations for hydrocarbon production in mature oil fields.

BACKGROUND

A mature oil field is also known as a brown field. Generating schedules of well settings, for example, mid-term (e.g., three years) schedules, for hydrocarbon production in mature oil fields or brown fields is not an easy task. During late stages of an oil field life cycle, oil and gas companies have a tendency to significantly decrease the number of new wells due to low potential return on investments, which may not be sufficient to justify additional capital expenditure. The choice of well control settings (e.g., wellhead choke size at injection wells or frequency of electrical pumps at production wells) in brown fields becomes then a main factor of asset efficiency.

Typically, in order to configure mid-term well settings one uses a set of numerical models to generate forecasts of fluid injection and production at each well as a function of time. Well settings are iteratively adjusted until a given performance metric (e.g., net present value associated with the next three years of production) is improved satisfactorily with respect to an existing baseline, which may correspond to a current schedule of well settings generated heuristically by an expert. Very often in practice, numerical models for production forecast have a relatively large number of parameters (e.g., parameters related to the heterogeneous distributions of rock properties, such as porosity and permeability, in the oil field). These parameters are set so that available information of the field (e.g., history of well production rates) is numerically reproduced. However, the amount of information available is frequently not enough to determine these parameters unequivocally. As a consequence, multiple combinations of model parameters reproduce available information within an acceptable level of accuracy. It should be noticed that these combinations of parameters yield in general different forecasts. The use of only one numerical model can be risky because the attendant prediction can be rather inaccurate. An imprecise prediction can lead to a bad choice of well settings in terms of performance metric. Therefore, the current approach in industry is to consider a set of numerical models (where each model reproduces available information) that provides as a whole an estimation of possible model parameters (since there are multiple models, this estimation will take the form of a collection of values) and allows more robust short-term and mid-term decisions because predictions can be made in a probabilistic manner; e.g., rather than saying that, for example, the field oil production rate after one additional year of production will be of 30,000 bbl/day (if this estimation is determined with only one forecast, the chances that the rate is wrong are, in general, high), one can estimate that the field oil production rate after one additional year of production will be of 25,000 bbl/day with a probability equal to 90% (and this estimation will be, generally, more accurate the higher the number of forecasts that are considered).

Generating a set of numerical models that reproduce available information is usually a time-consuming and complicated process. In order to reproduce available information such as well production and injection rates (which is a type of information commonly considered in most oil fields) physics-based simulations are used to determine how fluids flow in the reservoir. These simulations normally require the solving of computationally expensive systems of nonlinear differential equations. The adjustment of parameters for a single model to reproduce available information is, in general, an iterative process, so several of these time-consuming simulations need to be evaluated until results are deemed acceptable. If, instead of one model, a set of these models is calibrated, the associated computational cost can be prohibitive (e.g., few weeks even on a distributed-computing environment).

The use of few models or models that are not diverse enough or of models that are not geologically plausible may yield to inaccurate forecasts and as a consequence inefficient production of the corresponding oil field. Computing a relatively high number of diverse and geologically realistic models can be a rather time-consuming process and in cases may be prohibitive. Thus, in practice, many state-of-the-art tools for the generation of mid-term schedules of well settings aim at rapid implementations at the expense of forecasts that are based on a set of models that reproduces available information but that is not diverse enough and as a consequence may yield inaccurate predictions.

BRIEF SUMMARY

A method and system of configuring well settings in mature oil fields may be provided. The method, in one aspect, may include receiving a set of initial geological reservoir models that generate forecasts of fluid injection and production at a well as a function of time. The method may also include receiving historical well data comprising at least actual fluid injection and production data at the well over time. The method may also include receiving a specification associated with how the historical well data is to be progressively considered. The method may further include receiving an economic model that comprises mid-term estimation of oil sale price and of production costs. The method may also include generating progressively based on the specification, a plurality of geological reservoir models by fitting the set of initial geological reservoir models with a subset of the historical well data according to the specification to produce a set of intermediary geological reservoir models, and fitting the set of intermediary geological reservoir models to a next subset of the historical well data according to the specification. The method may also include determining from the plurality of geological reservoir models, a set of diverse geological reservoir models. The method may further include generating a mid-term schedule of well settings associated with the well based on the set of diverse geological reservoir models and the economic model. The method may also include actuating the mid-term schedule of well settings to control the fluid injection and production at the well.

A system of configuring well settings in mature oil fields, in one aspect, may include at least one hardware processor. A display device may be operatively coupled to the hardware processor. The hardware processor may receive a set of initial geological reservoir models that generate forecasts of fluid injection and production at a well as a function of time. The hardware processor may receive historical well data comprising at least actual fluid injection and production data at the well over time. The hardware processor may receive a specification associated with how the historical well data is to be progressively considered. The hardware processor may receive an economic model that comprises mid-term estimation of oil sale price and of production costs. The hardware processor may generate progressively based on the specification, a plurality of geological reservoir models by fitting the set of initial geological reservoir models with a subset of the historical well data according to the specification to produce a set of intermediary geological reservoir models, and fitting the set of intermediary geological reservoir models to a next subset of the historical well data according to the specification. The hardware processor may determine from the plurality of geological reservoir models, a set of diverse geological reservoir models. The hardware processor may generate a mid-term schedule of well settings associated with the well based on the set of diverse geological reservoir models and the economic model. The hardware processor may actuate the mid-term schedule of well settings to control the fluid injection and production at the well.

A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

DETAILED DESCRIPTION

Figure 1A:
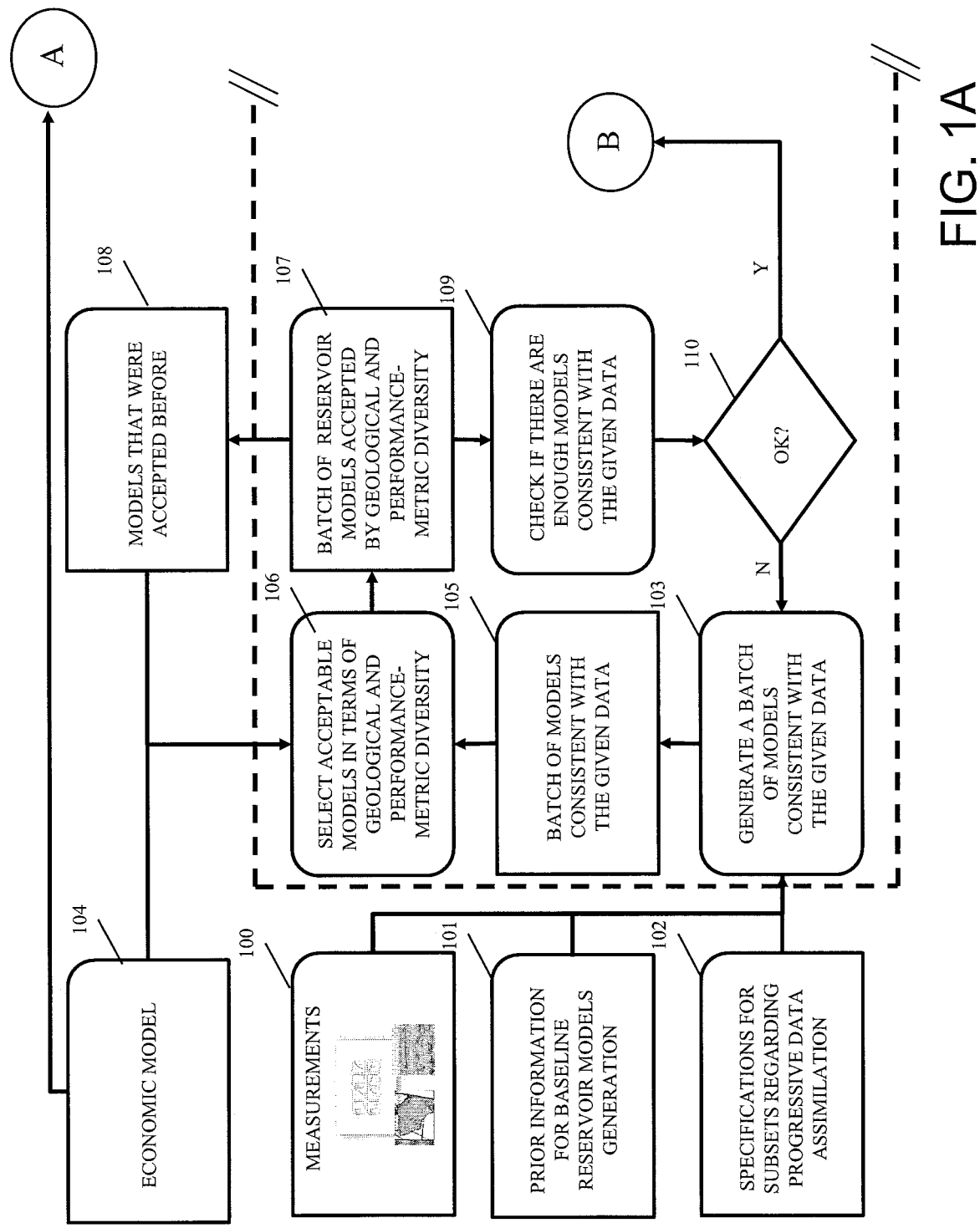
FIGS. 1A and 1B show a block diagram illustrating components of a system in one embodiment of the present disclosure.

A system, method, tool, and techniques may be provided that recommend with increased accuracy well settings for oil production in mature oil fields, and for example, that control the well settings according to the forecast for oil production in mature oil fields.

When multiple models that reproduce available information are generated, these models should be as diverse as possible to better capture multiple possible reservoir models that may yield different forecasts and be the basis of better informed decisions (e.g., two models characterized by similar parameters are effectively just one model, and from a predictive viewpoint they may provide redundant information). In addition, all models considered in the forecasts should be geologically realistic (e.g., generally, it is possible to reproduce available information by means of models that are not plausible from a geological perspective). The generation of schedules of mid-term well settings for hydrocarbon production in brown fields should be based on a relatively high number of diverse and geologically realistic models to compute production forecasts.

In one embodiment, the system of the present disclosure may determine a set of diverse models that are used to generate probabilistic production forecasts. This set of diverse models is calibrated with respect to available information resulting from measurements from the field, for example (e.g.), historical well injection and production rates. In one embodiment, rather than performing the calibration with this information all at once, the system may proceed progressively by increasing the amount of information in the data assimilation process. For example, for historical rates, the system may first consider, e.g., the first third of the history in the calibration, then the two thirds of the history and finally the entire history. According to an experiment performed of the system and method of the present disclosure, this progressive calibration reduces the computational cost of this time-consuming calibration process by 30% to 40% with respect to the calibration using all data in one shot. This factor can be expected to be larger in more complicated practical scenarios. In one embodiment, diversity of the models is implemented by means of a number of rules that prevent models from being geologically similar and from having similar production outcomes. For example, while two models may show geological dissimilarities in areas irrelevant to fluid flow, these two models may be essentially the same model as far as fluid flow is concerned, and for instance, also regarding any performance metric based on fluid flow, such as net present value associated with oil field production.

The system in one embodiment, in order to be computationally efficient, does not determine an unnecessarily large number of diverse models. In one embodiment, the system obtains a (relatively small) batch of calibrated and diverse models and iteratively incorporates additional batches of calibrated and diverse models (diversity applies to the total set that comprises all batches considered so far) until a given metric based on the variation of production forecast quantities (e.g., a collection of performance metric values) indicates that the last batch is not necessary. The size of the initial and subsequent batches can be estimated based on previous calibration processes performed for analogous oil fields. Additional models that reproduce available information but that may not contribute regarding diversity may be computed efficiently (e.g., via interpolation techniques). These additional models may be useful in analysis and visualization tasks (in the same way, interpolation in n dimensions helps to better understand and interpret data). By construction, all models generated are geologically realistic (i.e., they may not be discarded by a specialist due to lack of realism).

Geologically realistic models can be obtained by construction, for example, via changing parameters within admissible ranges for a model that is already deemed geologically realistic. The new set of improved and interpolated models (or alternatively, the set of diverse models before interpolation) that reproduces available measurements is used to improve (regarding a performance metric such as net present value associated with oil field production) a current baseline for a mid-term schedule (e.g., next three years) of well settings (e.g., wellhead choke size for injection wells). A system described in co-pending, co-owned U.S. patent application Ser. No. 15/298,893 filed on Oct. 20, 2016, incorporated herein by reference in its entirety, can be considered to obtain an improved schedule. A single model version described in that application may be extended to a collection of models, for example, via iteration for all models and computation of metrics that involve all models considered and a solution/schedule that is common to them.

The system and method of the present disclosure may provide the following advantages over the state-of-the-art systems. The progressive assimilation of information available has been experimentally observed to reduce by 30% to 40% the computational cost with respect to considering all information at once. Since model calibration accounts for most of the computational cost of the entire tool, it can be expected that this savings will be translated to computational savings regarding the complete system. Secondly, state-of-the-art solutions, in general, do not promote diversity. For example, the Ensemble Kalman Filter (EnKF), which is currently one of the most popular data-assimilation techniques, is based on calibrating an ensemble of models that, in many cases and for reasons yet unknown may collapse to a single model. In EnKF different subsets of available information are assimilated multiple times; while this approach may be computationally efficient, since all information available is never considered jointly in the calibration, the results obtained, in general, may be consistent with only part of the information available. On the other hand, the system and method of the present disclosure in one embodiment specifically promotes diversity not only from a geological perspective but also from a viewpoint that involves fluid flow and related performance metrics such as net present value associated with the production of the oil field of interest. Existing state-of-the-art techniques that allow one to control diversity to an extent, such as data assimilation based on multi-start optimization methods, do not provide strategies to determine how many models that reproduce available information one should use later on for the configuration of mid-term well settings. This lack of strategies may lead to either inaccurate prediction due to a number of models too small to capture variation properly regarding at least some of the reservoir parameters that impact fluid flow, or to a prohibitively time-consuming tool because of the excessively large number of models considered. The system and method in one embodiment of the present disclosure start from a (relatively small) batch of models and progressively add more batches until a given metric based on the variation of production forecast quantities indicates that the last batch is not necessary. Current state-of-the-art systems yield production forecasts that are typically trusted only for few months. The system and method of the present disclosure may extend significantly the period where forecasts can be trusted.

Figure 1B:
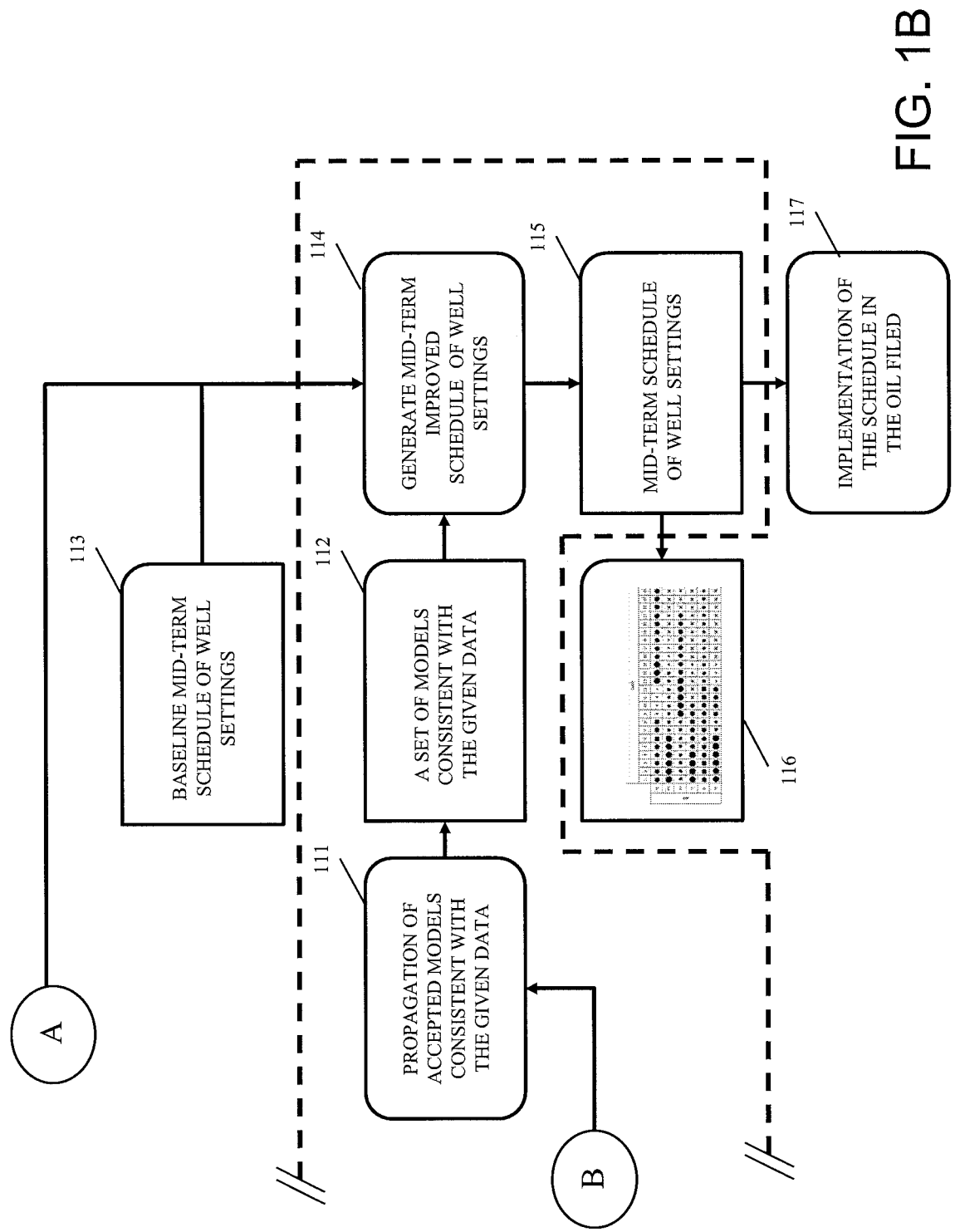

FIG. 1 is a block diagram illustrating components of a system in one embodiment of the present disclosure. Components (103) and (106) are further described in detail in FIGS. 3 and 4. The components execute on at least one hardware processor, for example, coupled to memory, a display device, one or more communication networks and one or more controller and/or actuators. The input to the system (100) includes the data available (e.g., historical well rates and/or other measurement data) to use to improve the predictive capabilities of models, a set of prior models (101) that provides a priori information regarding the reservoir, specifications regarding how data available is progressively considered (102), an economic model (104) used to validate new models computed and to generate a new optimized mid-term schedule of well settings, and a baseline mid-term schedule of well settings (113). The economic model (104) in one embodiment comprises mid-term estimation of oil sale price and of production costs. The output is a collection of new and improved well settings (115) that can be represented graphically (116). A well or wells may be actuated (117) by controlling or configuring well settings for the well or wells according to the output well setting schedule (115). A set of improved geological models (112) can also be provided as output for additional inspection.

The system uses the available historical information (100) and prior knowledge (101), together with the specifications regarding how data is progressively assimilated (102), to generate in (103) a first batch of geologically realistic/consistent models (105) that reproduce the initial subset of information within a previously determined satisfactory level of accuracy. This new batch with input from an economic model (104) is used in (106) to obtain a set of models that are acceptable in terms of geological and performance metric diversity (107).

The new set of models is stored (108) in order to be used in future iteration as input to (106). The system checks whether the number of geological diverse models should be increased (109). This checking can be based on an estimation of variance in forecasted values of performance metrics. Each model provides its own production forecast and thus allows one to estimate performance metrics such as, for example, net present value (NPV). When the system obtains a set of models that reproduce available information, the system can evaluate statistics of NPV for the set. If the addition of a new reservoir model (or a batch of models) to the set does not significantly change these values then it is considered that the system has a good understanding of possible variance of the forecasts and, hence, no further search of such models is needed. Whether the values have changed significantly may be determined based on comparing the values to a change threshold. For example, if the values produced by a set of reservoir models is within a threshold of those produced by the previous set of reservoir models, it may be determined that the number of geological diverse models is achieved.

An example methodology for determining whether there are enough models at 109 is described as follows. However, it should be noted that other methodologies may be employed, not limited to the following example. Assume that there are N geologically realistic models, consistent with history and deemed diverse from perspective of geology and performance metric. The method determines N production forecasts, for example, for the next three years, that correspond to these models and the method computes a statistic measure, for example, the variance of the net present value associated with the N forecasts, which the method denotes by $\sigma^2_N$. When the method receives another new model (again, geologically realistic, consistent with history and deemed diverse), the method determines a new production forecast for three years for that model and the method computes the new variance with the N+1 forecasts, which the method denotes by $\sigma^2_{N+1}$. If the difference between the two variances is deemed small, i.e., $|\sigma^2_N - \sigma^2_{N+1}|/\sigma^2_N < T_o^2$, with, for example, the tolerance (also referred to as threshold) $T_o^2$ equal to 0.05 (in the case of net present value or cash flow, this tolerance can be based on other tolerances related to actual monetary values) then the new model is not accepted since the quantification of the uncertain future prediction does not change within the accuracy given by $T_o^2$. Otherwise, the model is accepted and additional models to the now N+1 models will be considered. The procedure above can be applied to a batch of M another new (geologically realistic, consistent with history and deemed diverse) models.

Responsive to the system determining that the system does not have enough reservoir models (110 N) (e.g., the values changed beyond a significance threshold), the system generates a new batch in (103) and later selects those acceptable in terms of geological and performance metric diversity (106), this time including possible previous accepted models (108). Otherwise (as shown at 110 Y), the system goes through a computationally relatively fast stage of model interpolation (111), which conceptually proceeds similarly to interpolation of data in n dimensions. This stage does not in general increase diversity of the models but provides in a computationally inexpensive manner (when compared to the rest of the stages of the system) additional models that may be useful in analysis and visualization tasks (e.g., in the same way, interpolation in n dimensions helps to better understand and interpret data).

The new set of improved and interpolated models (112) (or alternatively, the set of diverse models before interpolation) is input, together with an economic model (104) and a baseline mid-term schedule of well settings (113), to a system (114) that outputs efficiently a new and improved mid-term schedule of well settings (115) which can be provided graphically (116) or directly implemented in the oil field (117) in an automated or autonomous manner. An example of the system (114) is described in co-pending, co-owned U.S. patent application Ser. No. 15/298,893 filed on Oct. 20, 2016.

Figure 2A:
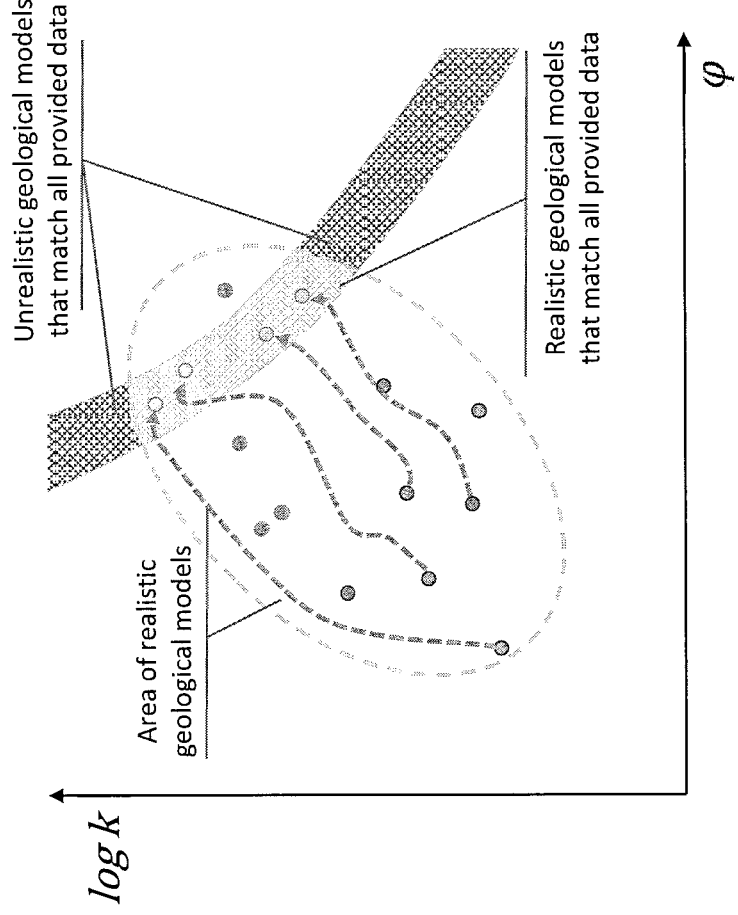
FIGS. 2A and 2B illustrate graph plots showing a search of models (in this case for porosity and logarithm of horizontal permeability) with complete (in one shot) and progressive assimilation of the available data in one embodiment of the present disclosure.
Figure 2B:
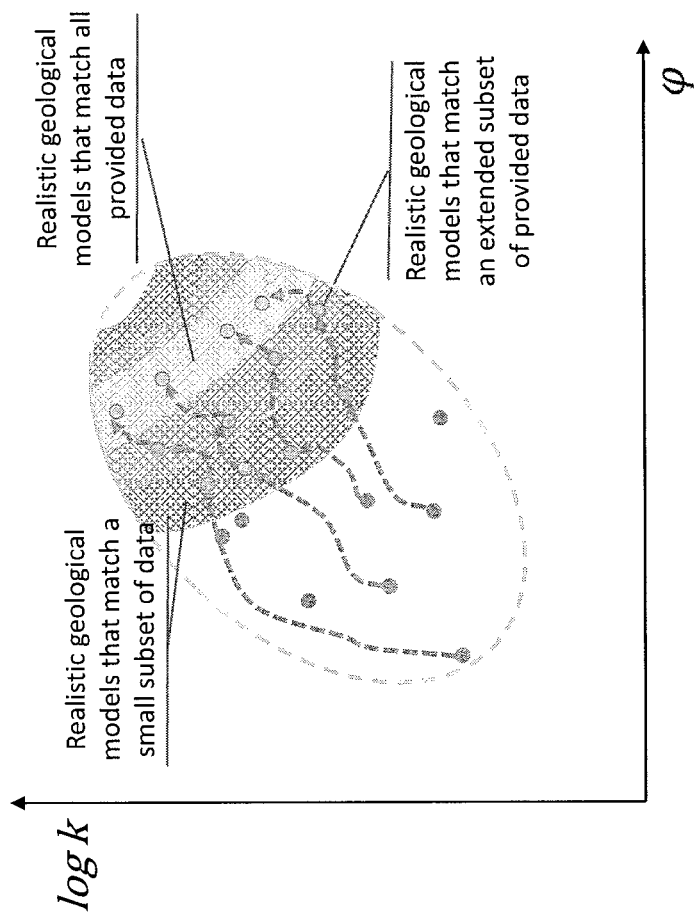

FIGS. 2A and 2B illustrate graph plots showing a search of models (in this case for porosity and logarithm of horizontal permeability) with complete (in one shot) and progressive assimilation of the available data in one embodiment of the present disclosure. The plot shown in FIG. 2A corresponds to a search of reservoir models matched for all available data. The plot shown in FIG. 2B corresponds to a search of reservoir models with a progressive assimilation of the available data.

The search of a single model that reproduces available data is by itself a time-consuming process: the more data there is to match, the more time it may take to find the corresponding reservoir model. To accelerate the process, the system in one embodiment provides a progressive assimilation of the measurement data. In the first step of this process, the data that is matched is a subset of the total data available (e.g., production well data for the first year out of ten years, or seismic data for only a region of the field). When there is less data to match, matching solutions can be, in general, determined in a more rapid manner than when there is more data to match.

Thereafter in the process, in a number of additional steps the system increases the data to be matched. More data in the search is expected, when this data is matched, to yield more accurate predictions. In each step the computations start from the solutions obtained in the previous step (using less measurement data). FIGS. 2A and 2B illustrate graphically this approach by means of an idealized example. In both plots, the two axes represent two parameters of the reservoir that are candidates for estimation (in practical examples, a higher number of parameters may be estimated), the mean porosity φ (horizontal axis) and the mean (decimal logarithm of the) horizontal permeability log k (vertical axis) for the rocks in the reservoir. The ellipse represents all the possible configurations of these two parameters that yield geologically realistic models. The band in dark grey shows all combinations of these two parameters that match the data with acceptable quality. The region in the band in light grey (which is the intersection of the ellipse and the grey band) comprises the set of matching solutions associated with geologically realistic models. In reservoir model calibration the system may aim, generally, at representing well this region with a discrete and relatively small number of solutions. If there are two sets of measurement data A and B to match and one, A, is a subset of the other, B, the analog of the light-grey region in FIG. 2A associated with B would be a subset of the region associated with A. FIG. 2A shows the outcome of a multi-start inversion algorithm for matching all available measurement data (e.g., ten years of injection and production well rates). FIG. 2B illustrates how the progressive assimilation algorithm (based, in this case, on multistart optimization) works by sequentially considering three sets of measurement data (e.g., two, five and ten years of injection and production well rates). The solutions are "pushed" or guided from far away to the set of geologically realistic solutions that match the data satisfactorily. In practical problems it can be expected that this set is relatively complex to find and that an approach where the solutions are guided along iterations may be more effective and efficient than when only the most restrictive set of data is used. In our experiments with a relatively simple synthetic model, the decrease in computation cost obtained was around 30% to 40%. Larger factors can be expected for more complicated models where the set of solutions is harder to find. In this type of problems a reduction in computational cost of 30% to 40% may easily mean days of computations (even on high-performance computing environments).

Figure 3A:
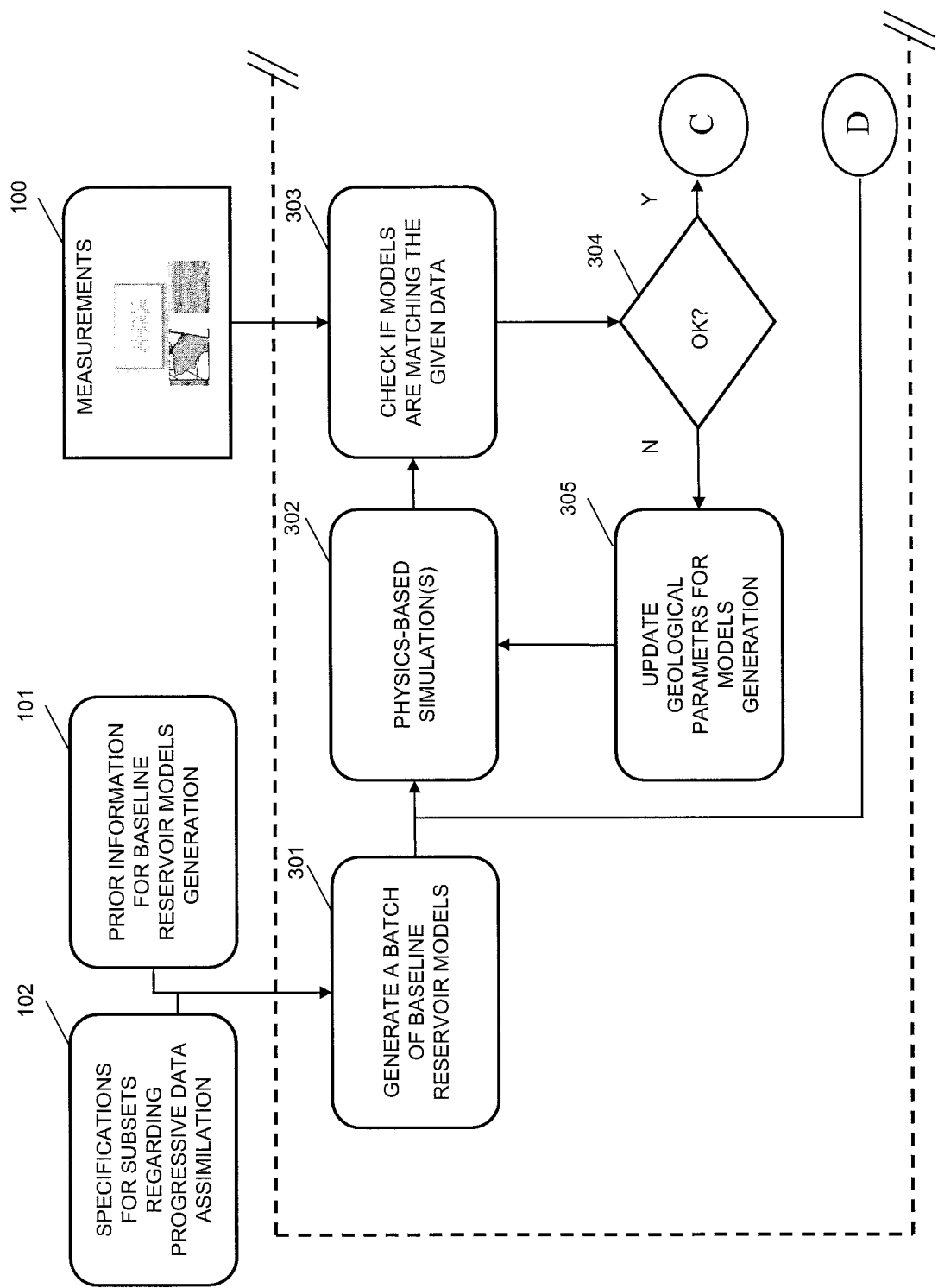
FIGS. 3A and 3B show a block diagram illustrating generation of models that match measurements using progressive data assimilation in one embodiment of the present disclosure.
Figure 3B:
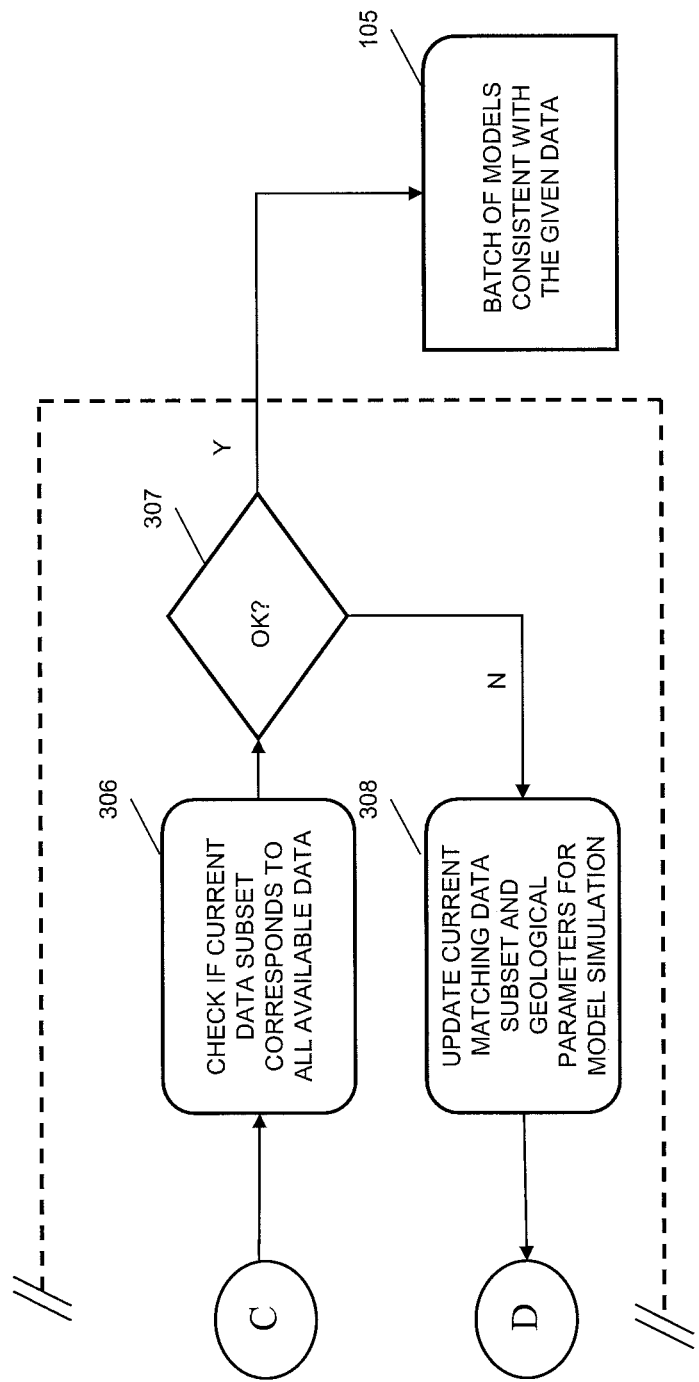

FIGS. 3A and 3B is a block diagram showing generation of models that match measurements using progressive data assimilation in one embodiment of the present disclosure. FIGS. 3A and 3B show a search process of a batch of models that match measurements with the progressive-assimilation method in one embodiment of the present disclosure. The process may include receiving or retrieving as input (102) the sequence of sets of data that are to be considered in the progressive assimilation (e.g., two, five and ten years of injection and production well rates) to accelerate the model matching. The choice of measurement sets may have an impact on the actual performance of the progressive-assimilation method. For instance, selecting a sequence of two, five and ten years of injection and production well rates may yield different results in terms of computational time than a sequence, for example, of one, three and ten years of those rates. The selection of these sets can be either input from an expert (for example, entered on a user interface by a user) or determined automatically or autonomously by a machine or processor (for example, by using criteria based on information content or entropy associated with each set of data). The process is started considering all prior information (101) (for example, from expert knowledge) and the less restrictive set of measurement data (102) (for example, the smallest set of measurements considered in the complete calibration, for instance, start the model calibration with the smallest set of measurements such as two years of injection and production well rates) by generating a batch of realistic reservoir models (e.g., combinations of reservoir parameters within the bounds that yield geologically realistic models) in (301). Prior information may be a set of models determined by an expert directly using geological modeling software (in interactive fashion) and relatively simple (geo-) statistical information (of the field under study or of other fields that may be geologically similar). This prior set of models is, in general, not consistent with the measurements in (100) since typically only static considerations are used in the construction of the models.

In one embodiment, the calibration process can be approached, for example, as a mathematical optimization problem where the optimization cost function is a measure of discrepancy between the measurements (100) and the numerical output of the physics-based model simulation (102). The optimization variables of this optimization problem may be, for example, multiple parameters related to rock properties such as permeability and porosity, to geological entities such as depths for the oil-water and gas-oil contacts or to fluid properties such as oil and gas relative permeability. The method may also determine constraints (for example, bounds) for these variables such that selections of values for these variables that do not violate constraints yield models that are deemed geologically realistic. A number of models in the batch of baseline models may be obtained based on prior information (for example, adjusting values of the optimization variables that yield models acceptably similar to those determined by an expert using geological modeling software). The remaining models can be also determined stochastically by drawing values of the optimization variables that satisfy the aforementioned constraints.

The system obtains in (303) a set of data to compare with measurements. If the measurements are well injection and production data, obtaining this data may involve executing reservoir flow simulation (302). In one embodiment, the physics-based simulation in (302) is used to map the set of reservoir models in (301), or the updated models in (305), to a set of numerical quantities (303) that can be directly compared with measurements (303) in order to quantify data match. If, for example, the measurements are injection and production well rates, reservoir flow simulation can be used in (302) to numerically estimate reservoir fluid flow and fluid injection and/or production at the wells. The inputs of reservoir flow simulation (302) includes the reservoir models in (301), which can be, for example, numerical descriptions related to rock properties such as permeability and porosity, to geological entities such as depths for the oil-water and gas-oil contacts and to fluid properties such as oil and gas relative permeability, and additional reservoir parameters (for example, data that is known due to available reservoir information). The input of reservoir flow simulation (or of another physics-based simulation) is used to determine parameters related to the equations used to model the physical phenomenon of interest (for example, fluid flow in porous media). These equations are used to generate the quantities needed for calibration with respect to measurements, and later on, to compute a pre-specified performance metric, which is based on predictions. The calibration can be approached in practice as a mathematical optimization problem, where the optimization cost function may be a measure of discrepancy between the measurements (100) and the numerical output of the physics-based model simulation (303).

The simulation (302), for example, outputs numerical quantities related to the behavior of an actual reservoir, for example, oil production. In general, other physics-based simulation(s) may be executed (e.g., wave propagation, if seismic data is considered). The data generated in (303) is compared to a subset of available data, for example, by means of a discrepancy metric such as the norm of the difference between simulation output and the subset of measurements, being consistent with the current step of the progressive assimilation method (102). If the difference is not deemed satisfactorily small at (304 N) for a predefined number of models, for example, as determined based on meeting a predetermined criteria or threshold, the system generates at (305) new combinations of geological parameters to reduce data discrepancy (for example, through mathematical optimization using all previous combinations of parameters already tested, for example, in a pattern-search algorithm such as Generalized Pattern Search (GPS) combined with a multi-start approach) and the process returns to (302) in the loop. The new combinations of parameters yield reservoir models that are geologically realistic (this can be achieved, for example, by selecting the parameters within predetermined ranges that ensure geological realism). If the discrepancy metric is deemed acceptable at (304 Y), the system checks whether the set of measurement data is the most restrictive (306), i.e., the largest set of measurements considered in the complete process (e.g., ten years of injection and production data in the example described above). If that is not determined to be the case at (307 N), the new set of measurements is incorporated in the system (308), and the last set of solutions obtained after the last successful checking at (304) is considered in the new loop at (302). If the most restrictive set of measurement data was already assimilated (307 Y), then a batch of solutions matched to acceptable quality and deemed geologically realistic is outputted at (105).

In one embodiment, the system provides a set of geologically acceptable models that match within a given level of accuracy the information available (e.g., well production data and seismic data). The information available is usually not enough to determine all the parameters in a reservoir model precisely, and the system in one embodiment of the present disclosure computes many of these reservoir models so that the system can consider a collection of forecasts to make more robust decisions. An example of this kind of decisions is determining a mid-term schedule (e.g., several months or few years) of well settings for which a given performance metric has to be optimized.

Figure 4:
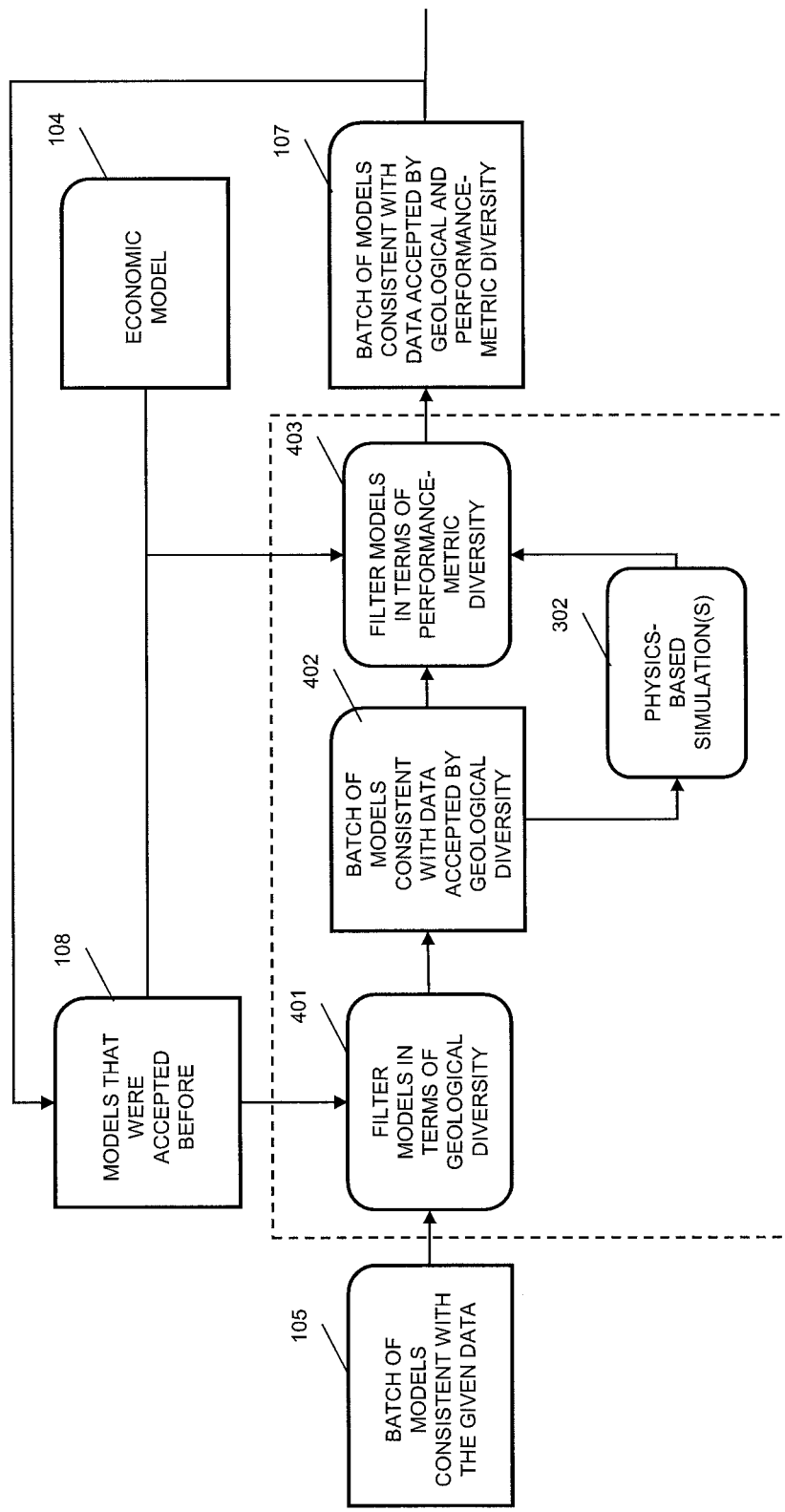
FIG. 4 is a block diagram illustrating a process for acceptance of models that match measurements based on diversity considerations in one embodiment of the present disclosure.

FIG. 4 is a block diagram illustrating a process for acceptance of models that match measurements based on diversity considerations in one embodiment of the present disclosure. It is expected that having a wide variety of possible reservoir models helps quantify better variation in performance metrics defined for a collection of models (which, in turn, can be used to estimate possible future performance of the true reservoir). The system, in one embodiment may aim at ensuring diversity in the models outputted in (112) at a stage (106) where model diversity is checked. This checking may include two steps illustrated in FIG. 4. The system receives a batch of models (105) that match history, and the system may discard models that are similar regarding geological considerations in the filtering shown at (401). For example, the system can consider the following definition of geological similarity: two models are geologically similar if they are described by a number of numerical values and the values that correspond to each model are comparable within a previously defined tolerance. In that checking, in one embodiment, the system considers not only the new batch of models (105) but also the set of previously determined (and stored) models (108). This checking (401) can be based, for example, on the computation of a distance measure between all models. For example, a numerical model can be a distribution in space of a rock property such as porosity (in practice there may be a number of these properties and other parameters such as those mentioned above). This distribution can be mapped to a vector of R components. Given two models, that is, two vectors of R components that represent a spatial distribution of porosity, the method can compute the norm of their difference. If this norm is smaller than a pre-specified tolerance (which, in turn, can be determined, for example, based on expert judgment related to the particular reservoir property or parameter), the two models are deemed to be geologically similar. This concept of similarity can be extended to more complex geologically models that can be eventually mapped to a set of numerical values. In this case, if the distance between two models is smaller than a given acceptability threshold then only one of these models is kept (the other model is discarded; since both models are equivalent for practical purposes, it is irrelevant which model of the two is discarded). After considering all models, a set of models that are acceptable regarding geological diversity exist as shown in (402), and for example, saved.

Another example of how to ensure geological diversity for models described by a number of numerical values can be based on the following. The system may take the first model in the new batch of new models and determine if the corresponding numerical values can be written as a convex combination of the values from the set of existing (and stored) models (a convex combination is a linear combination where all the weights are non-negative and add to one). Mathematically, the system may check whether the new model is in the convex hull obtained with the set of existing models. Determining convex hulls can lead to efficient and compact representation of regions or sets of interest. If that convex combination is possible, then the model is discarded. Otherwise the model is added to the set of existing models and the next model in the new batch of models is considered. The system may proceed likewise until all models in the new batch of models are considered.

When the set of existing models is obtained for the first time (i.e., very first batch of new models), models that can be written as convex combination of other models in this set are discarded.

The system may also discard models that, for a given set of future production scenarios (e.g., multiple schedules of well settings), are similar regarding a given performance metric (403).

Physics-based simulation(s) (302) may be also executed to obtain data (e.g., future production data) considered in (403). For example, the system can consider the following definition of performance similarity: two models are similar regarding a given performance metric if the performance associated with a model is described by a number of numerical values, and the values that correspond to both models are comparable within a previously defined tolerance; the values that describe performance for a given model could be, for example, the set of net present values obtained for a collection of configurations of mid-term well settings. This performance metric may be the same performance metric considered later in the obtaining of the subsequent configuration of well settings (114). This rationale behind this second filtering step (403) is that two models can be geologically different in a region that does not influence noticeably fluid flow and, consequently, their respective performance will be, within an acceptable level of accuracy, the same. The checking can be based on the computation of a distance measure between the performance metric values for all models. If the distance between two models is smaller than a given acceptability threshold then only one of these models is kept (the other model is discarded; since both models are equivalent for practical purposes, in one embodiment, it is irrelevant which model of the two is discarded). Any one may be selected for keeping.

In one embodiment, the checking may employ an economic model (104) and the values of performance metric associated with previously determined (and stored) models (108). An example of an economic model is a computation of net present value for future production based on a prediction of future oil price, an estimation of production costs and a discount factor.

After considering all pairs of models, a set of models that are acceptable regarding geological and performance-metric diversity is produced at (107).

Figure 5:
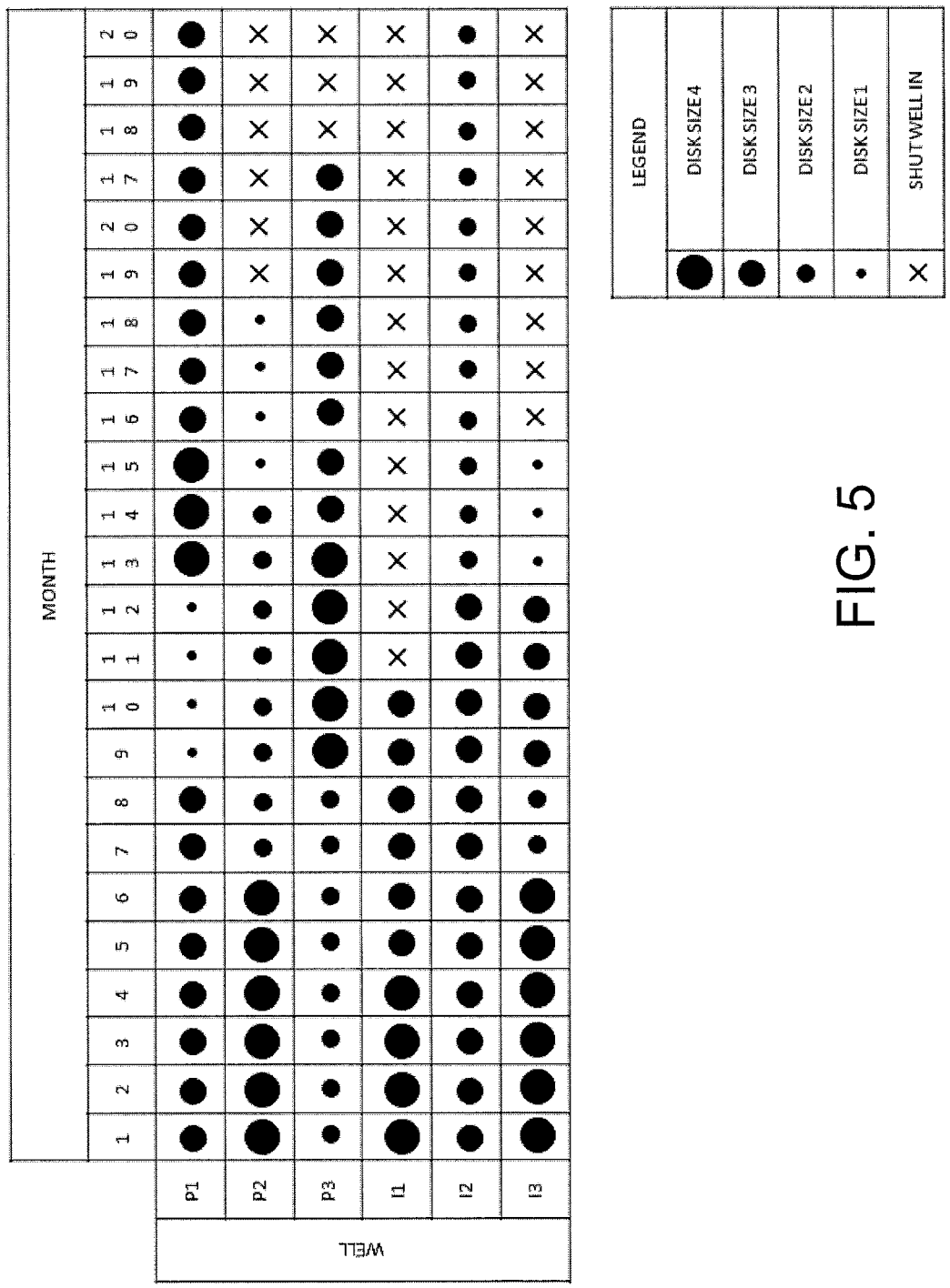
FIG. 5 shows an example of the graphical output that is generated in one embodiment of the present disclosure.

FIG. 5 shows an example of the graphical output that is generated in one embodiment of the present disclosure. Based on a diverse collection of geologically realistic models that have been calibrated with respect to available data, the system may leverage their improved predictive capabilities in order to modify a mid-term schedule of settings for the wells in a given field. A method described in U.S. patent application Ser. No. 15/298,893 may be employed to modify a mid-term schedule of well settings based on the improved predictive capabilities. In one embodiment, such method may be applied to each model in the set (e.g., generate mid-term accurate and long-term approximate predictions for each model) with the performance metric based on statistics (e.g., the average) for each performance metric associated with each geological model. The selection of most important wells and generation of new mid-term schedule of well settings may be done based on the statistics considered for the performance metric (notice that in practice there will be a unique schedule of well settings). The validation and adjustment may be done based also on an aggregated metric (e.g., a statistic measure) for the long-term predictions for all the geological models.

The table shown in FIG. 5 represents an example of the mid-term schedule (20 months in this case) that specifies on a monthly basis the corresponding well choke sizes needed for the valves installed in all $N_w$ wells in the field (in this example there are three producers, P1, P2 and P3, and three injectors, I1, I2 and I3; hence, $N_w$ is equal to six). In this example, it is assumed that four choke sizes are available, which are represented by circles of different radius. The schedule also indicates if some of the wells have to be shut in (this is denoted in the table by means of a cross sign). The system in one embodiment may also directly actuate well settings, for example, automatically or autonomously.

In another aspect, a graphical user interface (GUI) tool may also be provided that steps a user through configuring well settings. FIGS. 6-18 illustrate screen shots of a graphical user interface in one embodiment of the present disclosure.

The system and method in one embodiment of the present disclosure provides for improvement and selection/deselection of models used to generate production forecasts. These models may be stored in a computing system so that they can be consulted in decision-making scenarios related to the configuration of mid-term schedules of well settings. In one embodiment, model improvement is based on progressive calibration using measurements. In one embodiment, model selection/deselection is based on progressive calibration but also on diversity between models (e.g., if two models are deemed similar, one of them is deselected). In one embodiment, diversity is based on static (e.g., geological descriptors) and on dynamic (e.g., production forecasts) considerations. In one embodiment, the system and method keep selecting additional models until it is determined that the number of models is adequate. Adequate number of models is determined so that too few models would not lead to inaccurate production forecasts and so that an excessive number of models would not translate in the system being prohibitively time-consuming.

A GUI is provided that supports the process of model improvement and selection/deselection of models, for example, and allows the user to inspect the models and interact with the workflow. The GUI screen shots illustrate a model improvement and selection/deselection process of the present disclosure in one embodiment, for example, workflow of the process, with an example of the configuration of mid-term schedule of well settings for a small reservoir with three producers and two injectors. The data used to model calibration are (cumulative) oil production volume for each of the three producers sampled every month during the past 7 years (the three producers were all active during this period).

Figure 6:
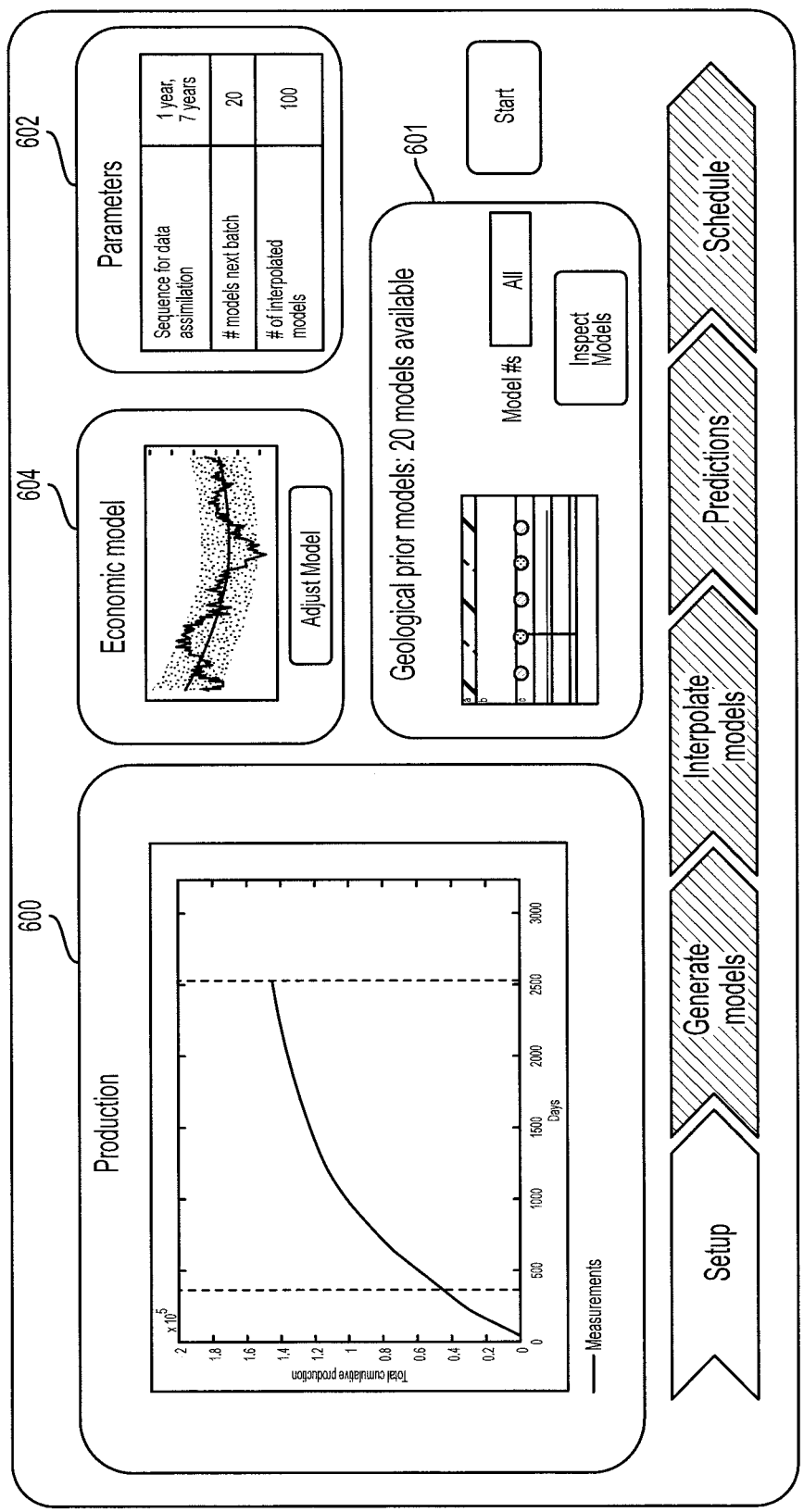
FIGS. 6-18 illustrate screen shots of a graphical user interface in one embodiment of the present disclosure.

FIG. 6 shows a GUI display that allows the user to interact with the input of the process before it starts. FIG. 6 may be considered a setup screen, via which a user may setup input. For example, the GUI visualizes measurements (in this case, historical field cumulative production volume as a function of time), allows the user to adjust the economic model (e.g., oil price for the next 20 months), input parameters in the process (sequence for the progressive data assimilation, number of models expected in each calibration batch and number of models in the interpolation stage) and inspect the initial set of models provided by the user. The window shown at 600 corresponds to the measurements shown in FIG. 1 at 100; the window shown at 602 corresponds to the parameters, specifications for subsets regarding progressive data assimilation, shown in FIG. 1 at 102; the window shown at 604 corresponds to the economic model shown in FIG. 1 at 104; the window shown at 601 corresponds to the prior model information, prior information for baseline reservoir models generation, shown in FIG. 1 at 101. The GUI allows the user to adjust or enter the input.

Figure 7:
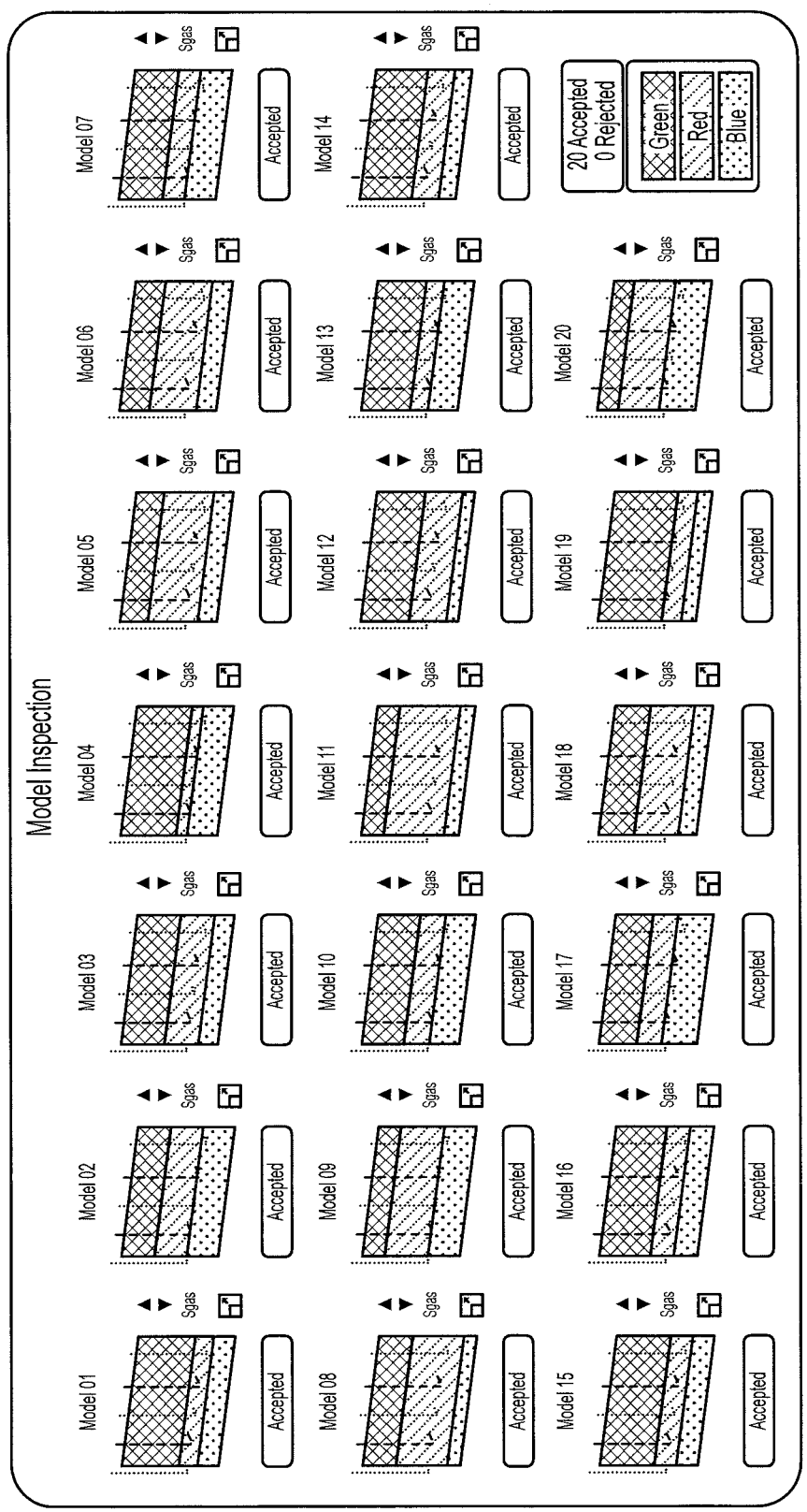

In the example, the user provides 20 models and all of them are required to be inspected. FIG. 7 shows an example model inspection GUI screen shot at the beginning of the process, in one embodiment of the present disclosure. FIG. 7 shows the saturation of gas (Sgas: color-coded, e.g., green, red and blue denote high, medium-low and low values, respectively) in each of the three layers of the model. Other properties such as oil saturation, water saturation, rock porosity and rock permeability may be selected via the spinners next to each individual plot (which can be also maximized and inspected individually through the corresponding icon). At the beginning of the process all these 20 models are accepted.

Figure 8:
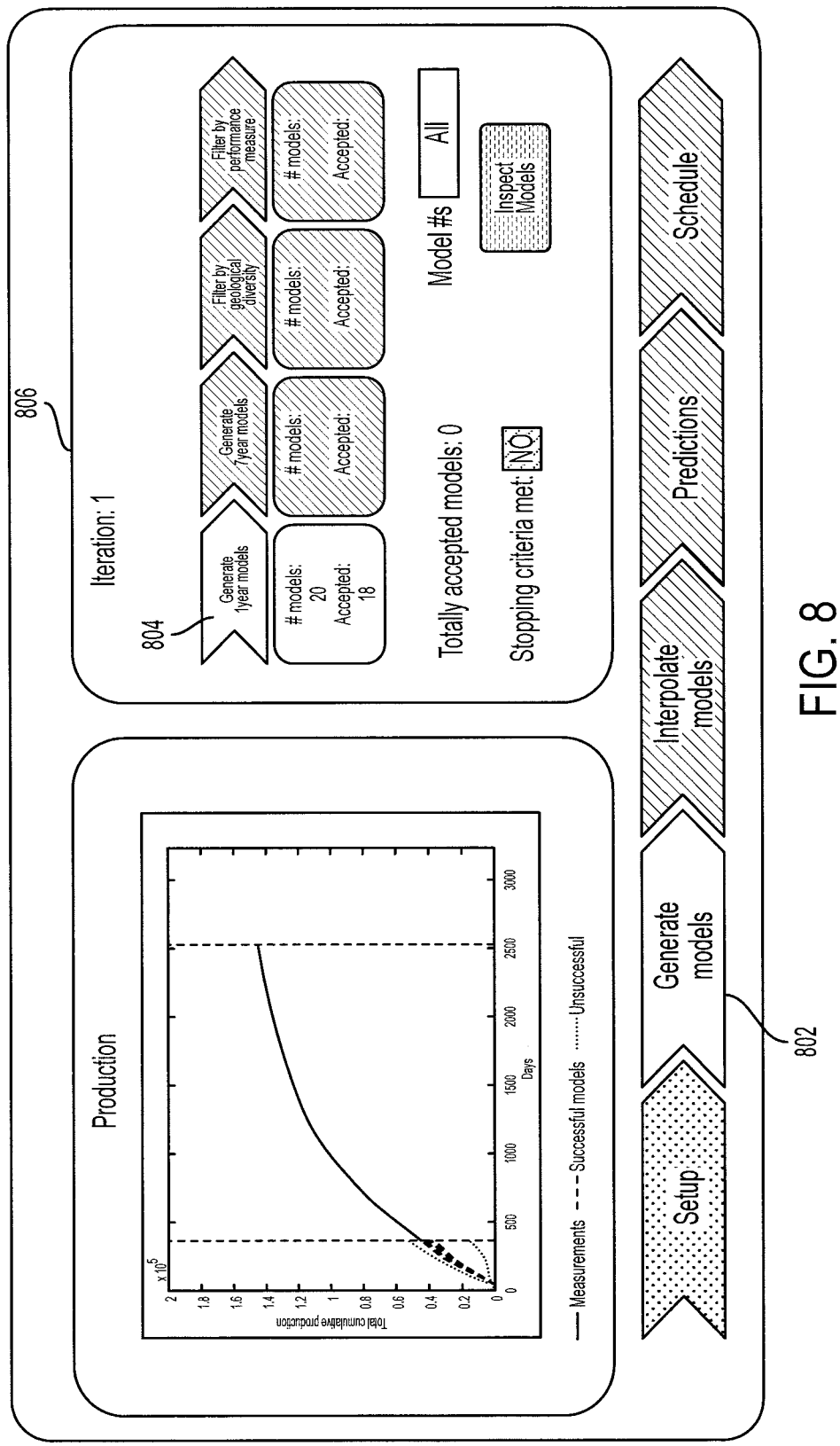
Figure 9:
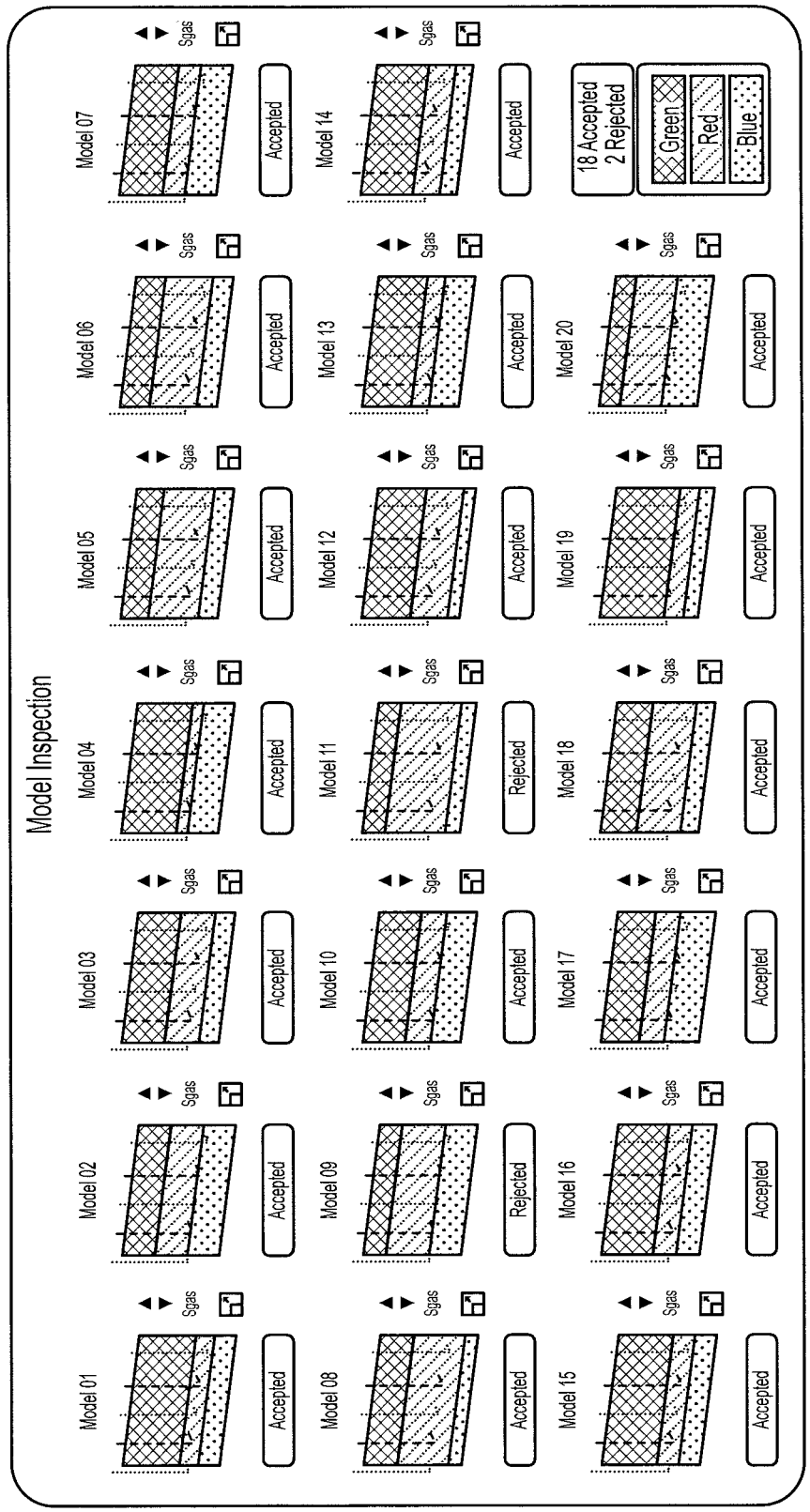

The user may initiate the calibration, selection and/or deselection process by pressing the 'Start' Button on the GUI shown in FIG. 6. Based on the inputs provided, a batch of new 20 models is expected. Each of the models is calibrated, for example, using 1 year of production data. FIG. 8 shows an example of the attendant GUI in one embodiment of the present disclosure. The 'Generate models' button or process 802 that is highlighted illustrates that the functions described in FIG. 1 at 103, 105-110 are being executed. The GUI also shows a window 806 showing the iteration of those functions. The 'Generate 1 year models' button or process 804 is highlighted illustrating that procedures or functions described in FIG. 3 at 302-308 being executed. Thus, the GUI visualizes a walkthrough of a workflow throughout the process. In the example GUI shown in FIG. 8, the system provides the information that two out of the 20 original models were deselected based on significant discrepancies between their calibration and measurements (the unacceptable mismatch may be shown with color-code, for example, red, in the figure, for example, when compared to the measurements). FIG. 9 shows a GUI display showing inspection of models after first stage of progressive data calibration in one embodiment of the present disclosure. In this new model inspection GUI, access to the new set of 20 models is provided. In this example, color-coded (e.g., red) markers highlight the two deselected models.

Figure 10:
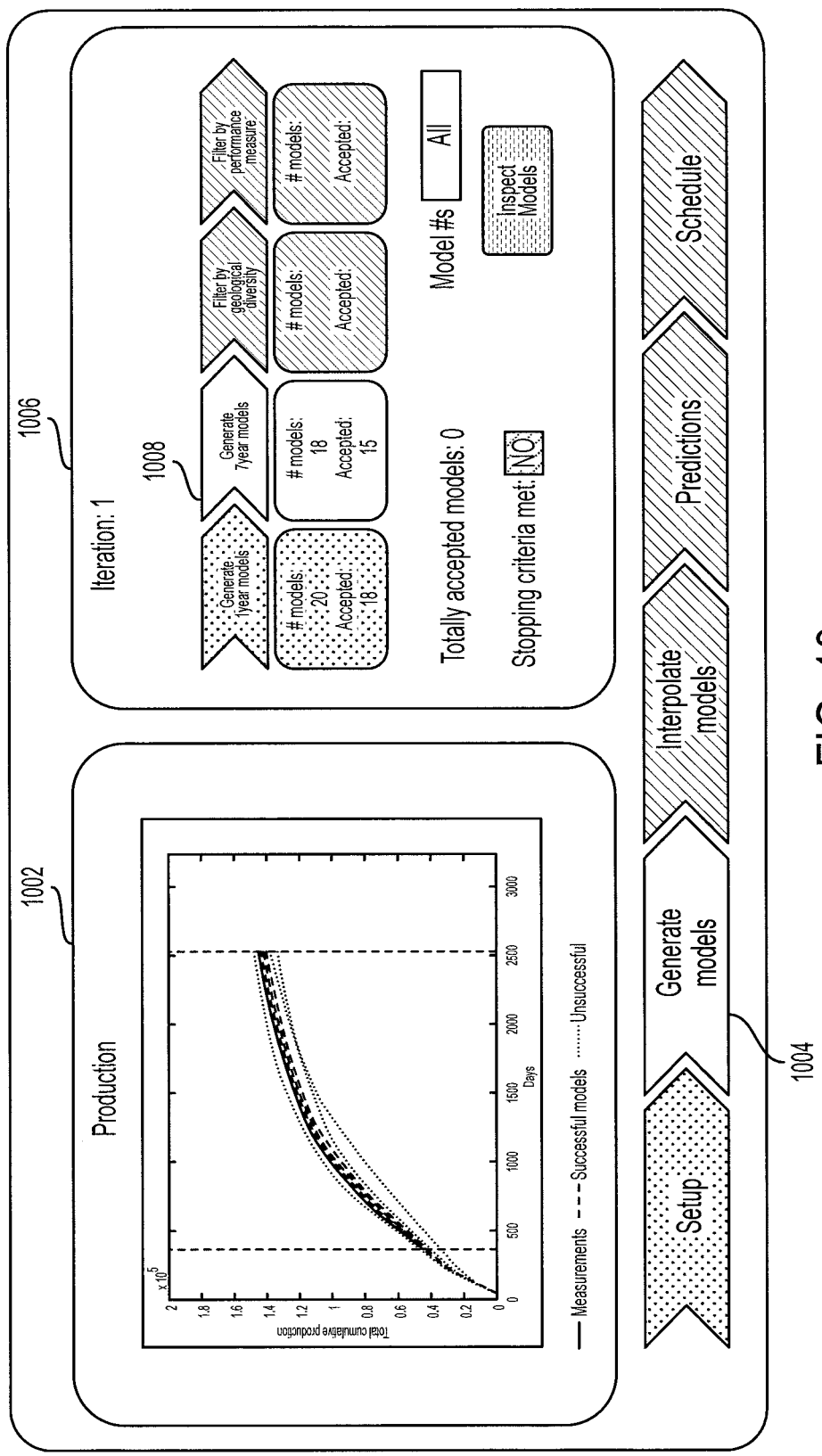
Figure 11:
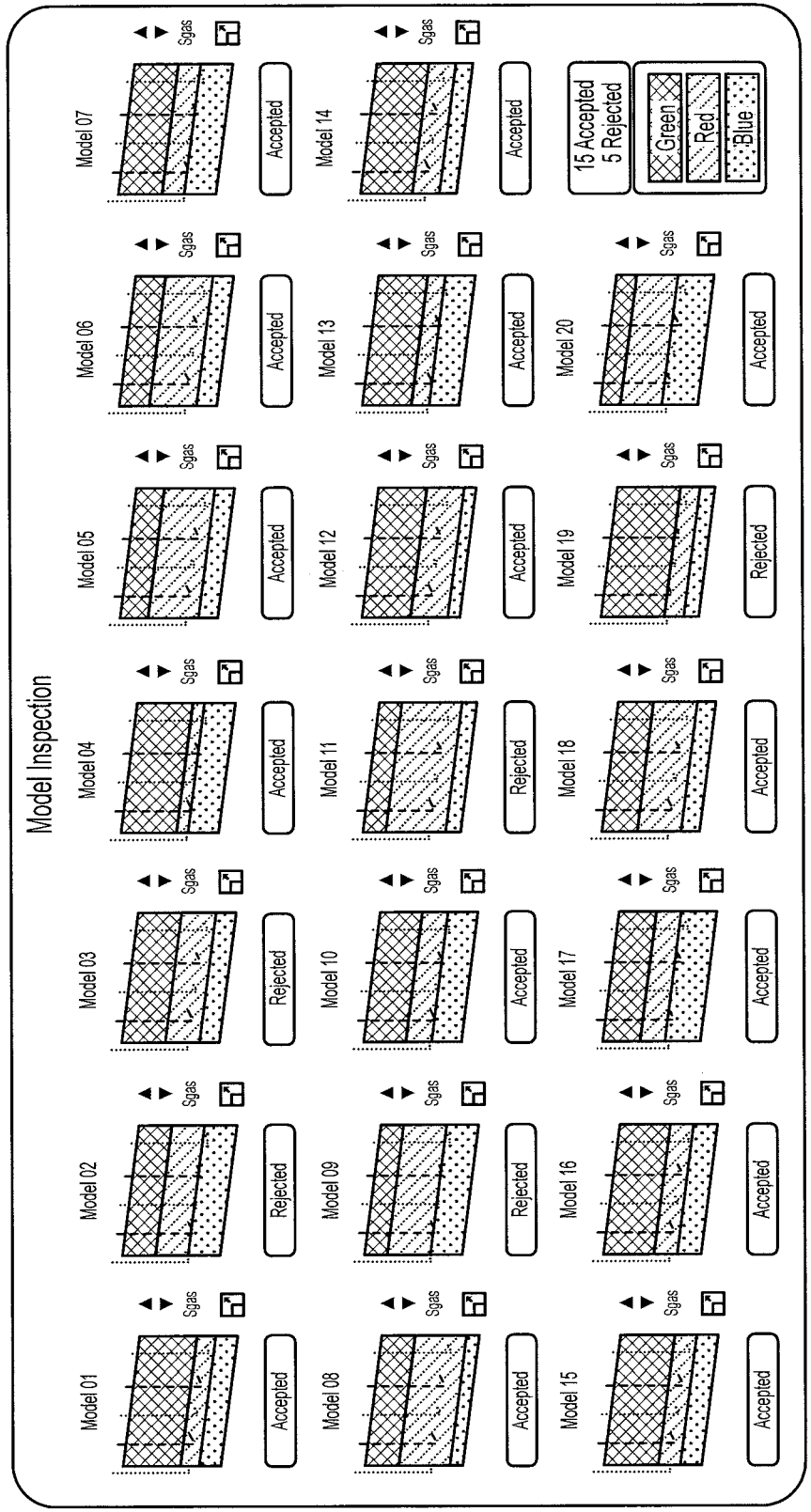

The overall process continues, as indicated in the setup GUI with the calibration using all measurements available, which in this example case corresponds to 7 years of well production data. The GUI provides a new update of the calibration, selection, and/or deselection process. FIG. 10 shows an example of output GUI display after second (e.g., final) stage of progressive data calibration in one embodiment of the present disclosure. The window at 1002 corresponds to the measurement data taken into account in the process at 105 in FIG. 1. This GUI display still shows the 'Generate models' highlighted as shown at 1004 indicating that the functions described at 103, 105-110 in FIG. 1 are being executed. The iteration window 1006 shows the 'Generate 7 year models' stage 1008 is being executed, for example, the functions described at 302-308 in FIG. 3. In this stage, three additional models have been deselected based on discrepancies (with respect to the 7 years of measurements that are not acceptable). FIG. 11 shows an example model inspection GUI after second (e.g., final) stage of progressive data calibration. The GUI allows for inspection of the 15 accepted models during this stage of calibration with respect to measurements.

Figure 12:
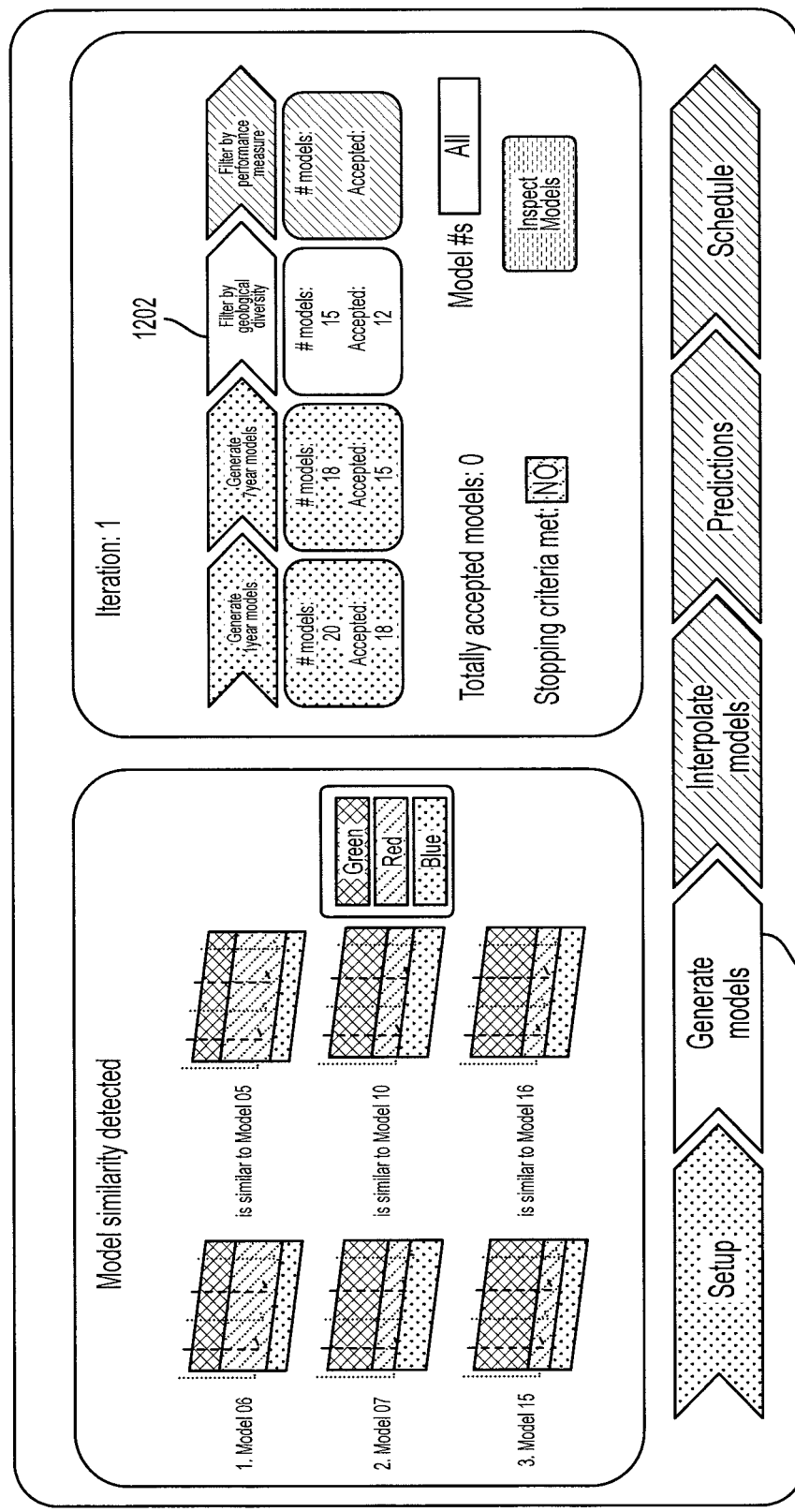
Figure 13:
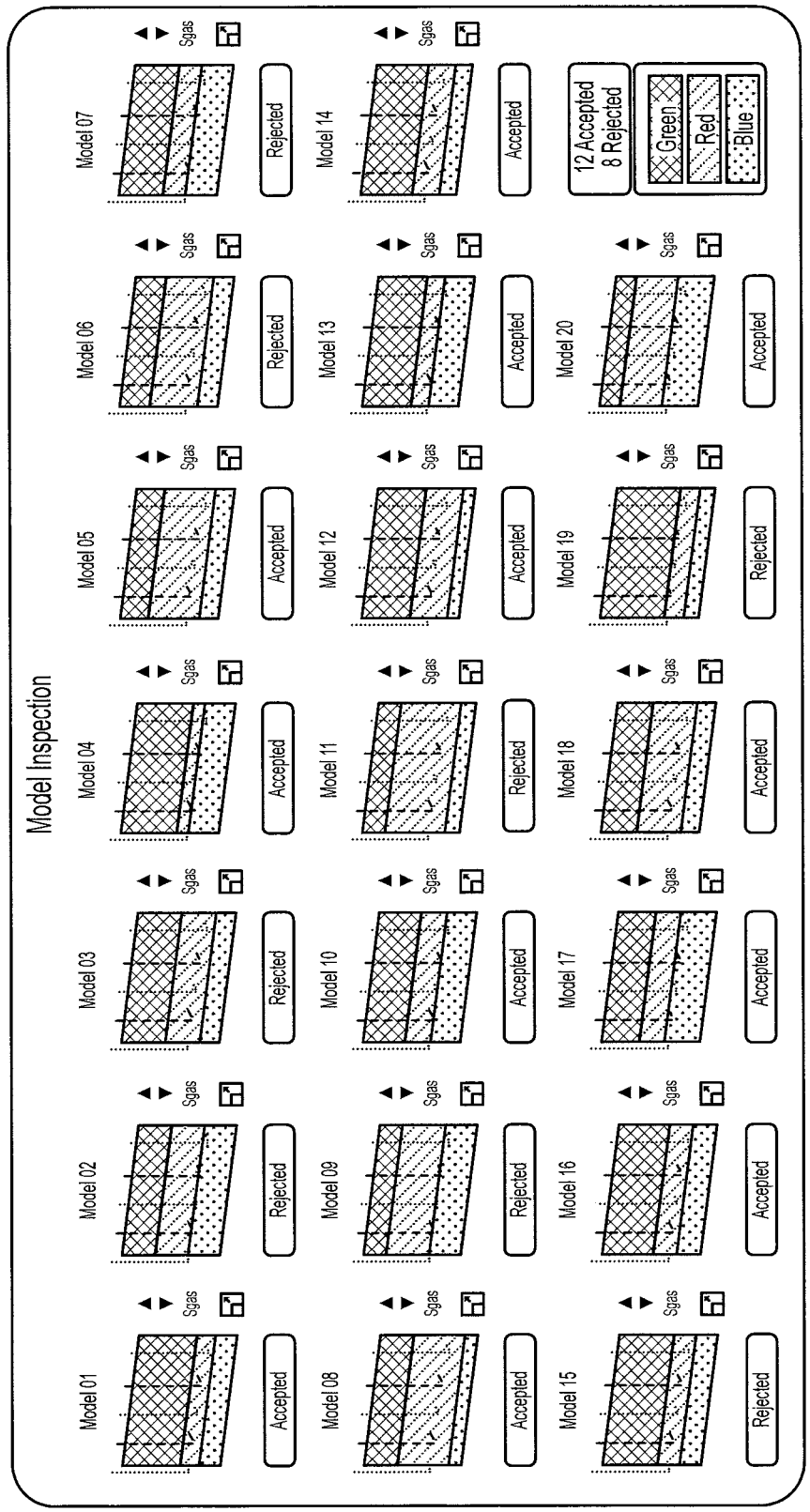

Next, the system may filter the remaining models (out of the batch of 20 models) based on geological considerations. In this analysis, the system detects that Model 06, Model 07 and Model 15 are similar to Model 05, Model 10 and Model 16, respectively, as shown in FIG. 12. FIG. 12 illustrates an output GUI display corresponding to filtering to promote geological diversity in one embodiment of the present disclosure. The GUI display shows 'Filter by geological diversity' button or process 1202 as highlight to indicate that the process, for example, described at 401 in FIG. 4 is being executed as part of the 'Generate models' process, also shown as highlighted at 1204. A GUI display visualizes the accepted models after this filtering stage. FIG. 13 illustrates a model inspection GUI showing an example of model visualization after filtering to promote geological diversity in one embodiment of the present disclosure.

Figure 14:
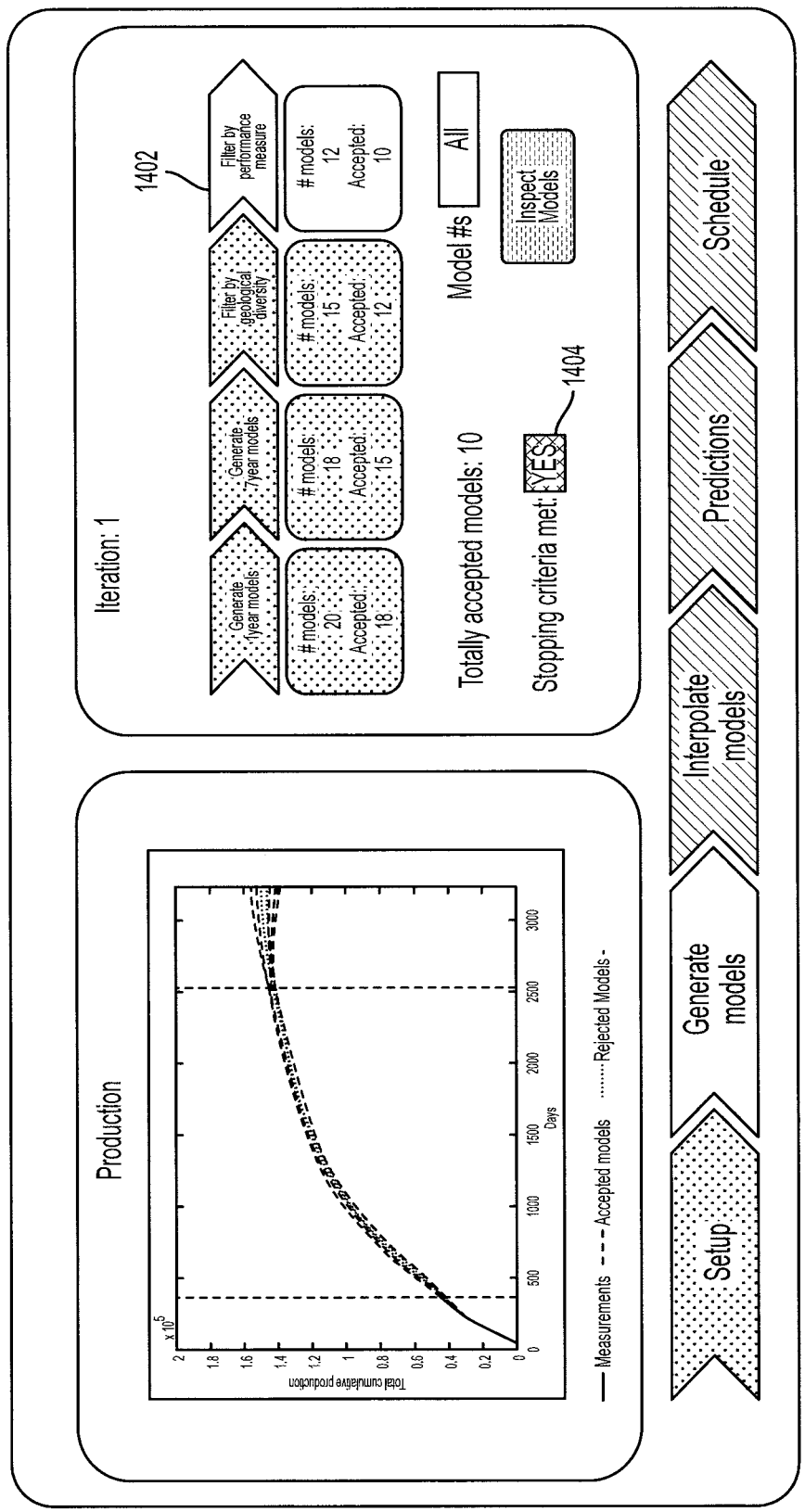
Figure 15:
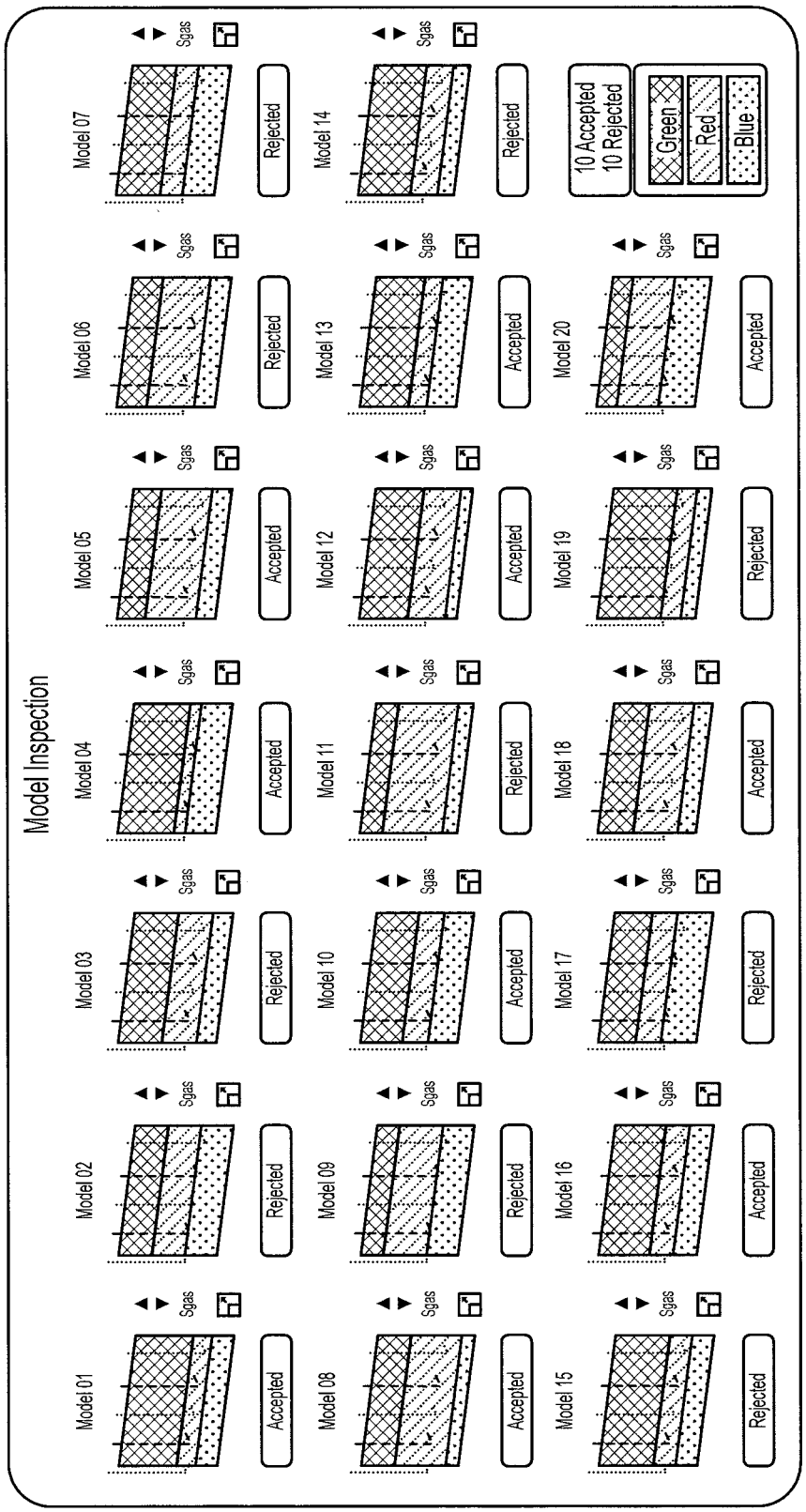

Thereafter, the models are subjected to an additional filtering stage based on considerations related to the performance metric used in the subsequent stage where the mid-term schedule of well settings is optimized. This performance metric relies on production forecasts, and this information is used to further screen the set of models. FIG. 14 shows the corresponding output GUI display in one embodiment of the present disclosure. The GUI display highlights the 'Filter by performance measure' button or process 1402 to indicate that the function corresponding to 403 in FIG. 4 is being executed. The GUI display also shows whether a stopping criteria is met or not met, for example, at 1404, for example, corresponding to the process executed at 109-110 in FIG. 1. In this filtering stage, two more models, which are found to yield similar contribution in the forecast as other models, are deselected. Thus, this iteration of the calibration, selection and deselection process outputs 10 diverse models that are consistent with the 7 years of historical production data. The system in one embodiment checks whether this number of models (in this example case, 10) is adequate regarding variability of statistics of future production. In this case, 10 models are deemed adequate (e.g., the stopping criteria set in the GUI are satisfied) and the overall calibration, selection and deselection process terminates here. FIG. 15 illustrates another inspection GUI in one embodiment of the present disclosure that visualizes the 10 selected and 10 deselected models corresponding to the example at this filtering stage. FIG. 15 shows an example model inspection GUI after filtering to promote performance-metric diversity.

Figure 16:
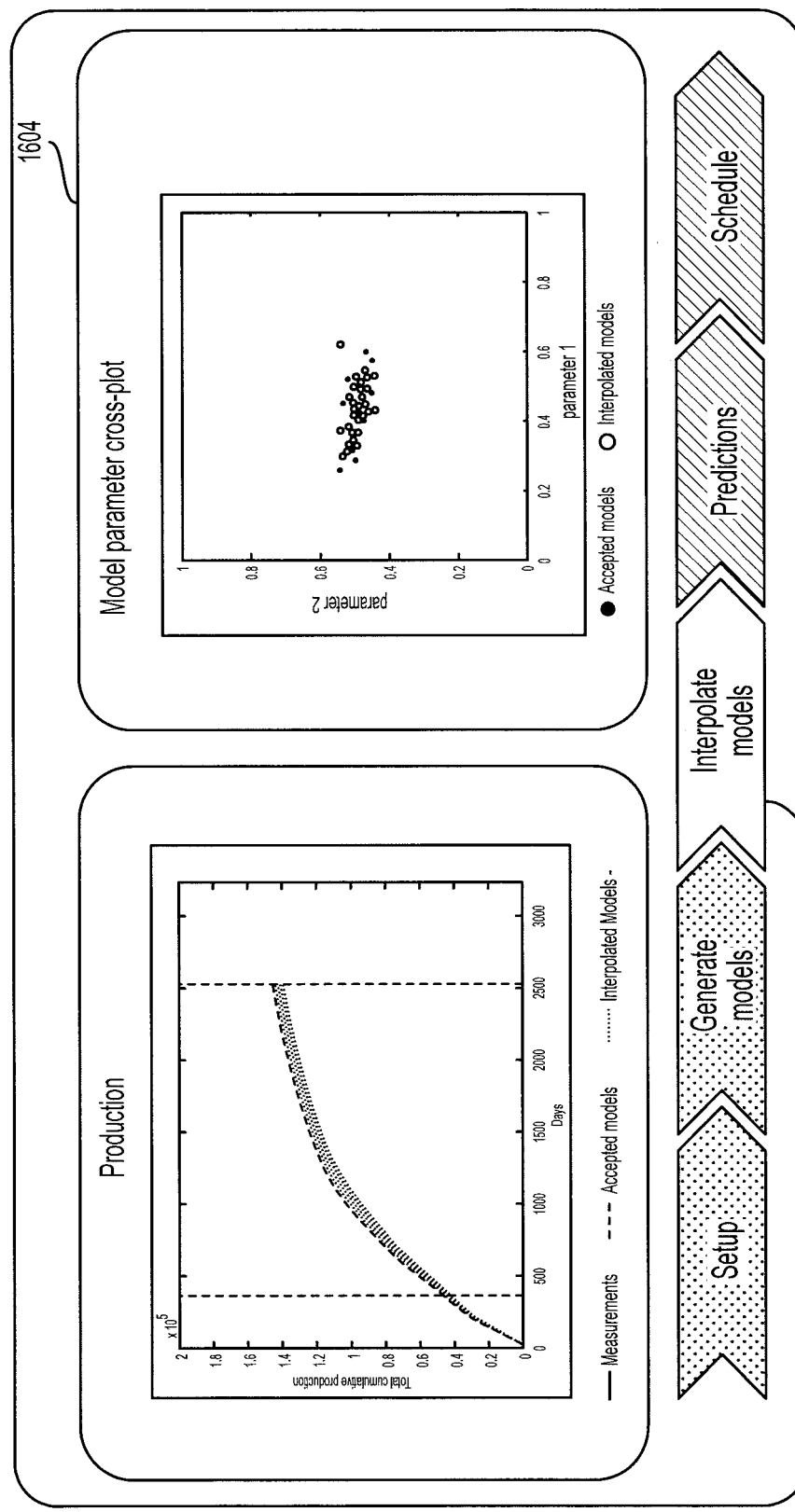

The subsequent model interpolation stage generates (e.g., rapidly) a total of 100 models (as specified in the setup GUI). FIG. 16 shows an example GUI display that is output and associated with the interpolation models, in one embodiment of the present disclosure. The GUI display highlights the 'Interpolate models' button or process 1602 to indicate that the function described in FIG. 1 at 111 is being executed. The window at 1604 shows some parameters from a set of models consistent with the given data (FIG. 1, 112) graphically on the GUI. The additional 90 models may, in general, not contribute as far as diversity is concerned (i.e., toward diversity aspect). This interpolation stage can be useful with respect to further analysis and visualization of the models obtained that will be used next to compute an improved mid-term schedule of well settings. FIG. 16 shows an example of a GUI that a user has access to at this interpolation stage, where interpolated production and a cross-plot of model parameters are included.

Figure 17:
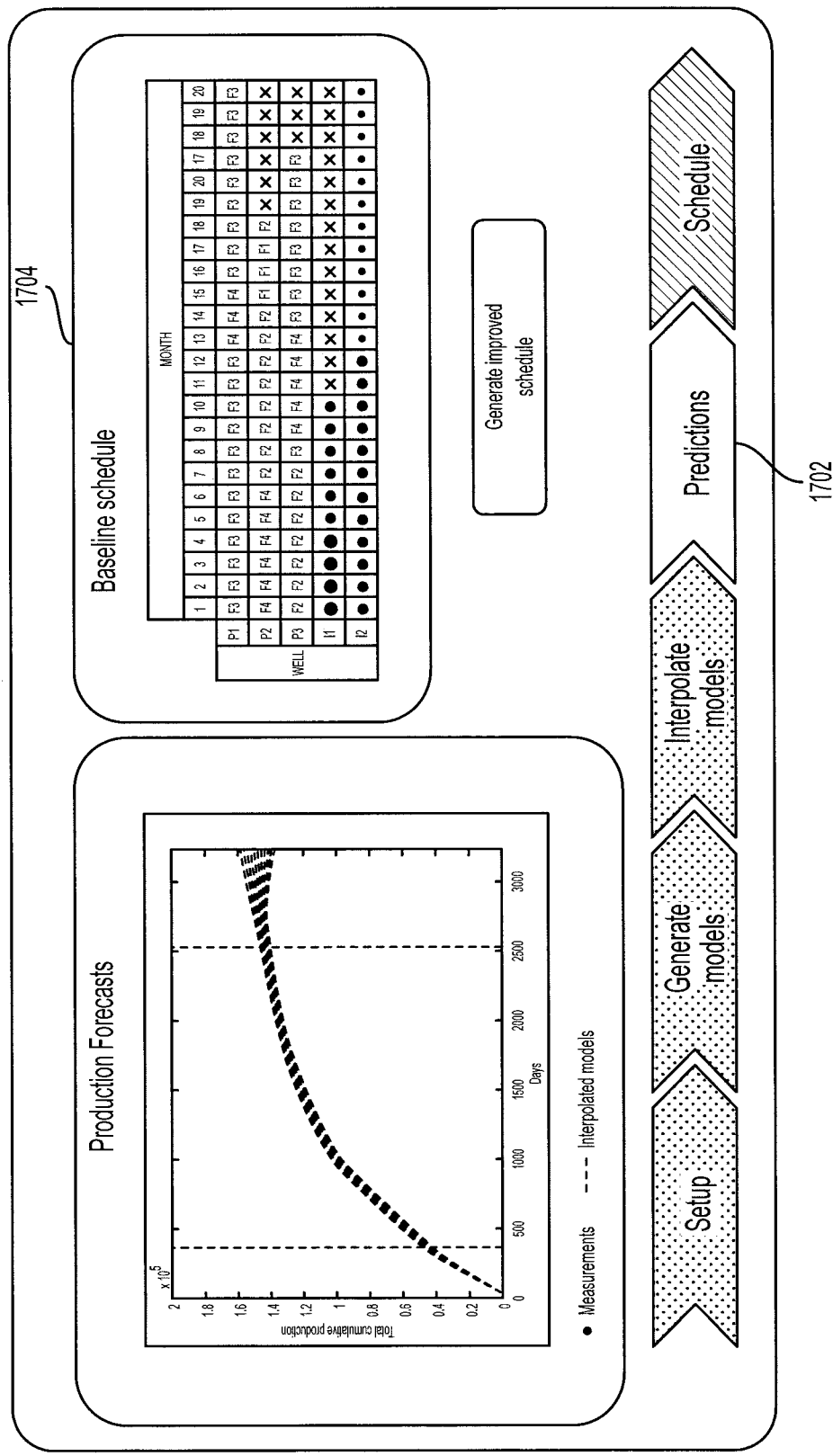

The interpolated models can be used to generate probabilistic forecasts, which, in turn, may be combined, for example, with optimization algorithms to improve an existing baseline for the mid-term schedule of the well settings. FIG. 17 shows an example of a GUI display that allows the user to inspect this baseline, together with the associated forecasts in the GUI. The GUI display shows the 'Prediction' button or process 1702 highlighted to indicate that the function corresponding to 114 in FIG. 1 may be executed. The window at 1704 shows a baseline mid-term schedule of well settings (e.g., FIG. 1 at 113) graphically on the GUI.

Figure 18:
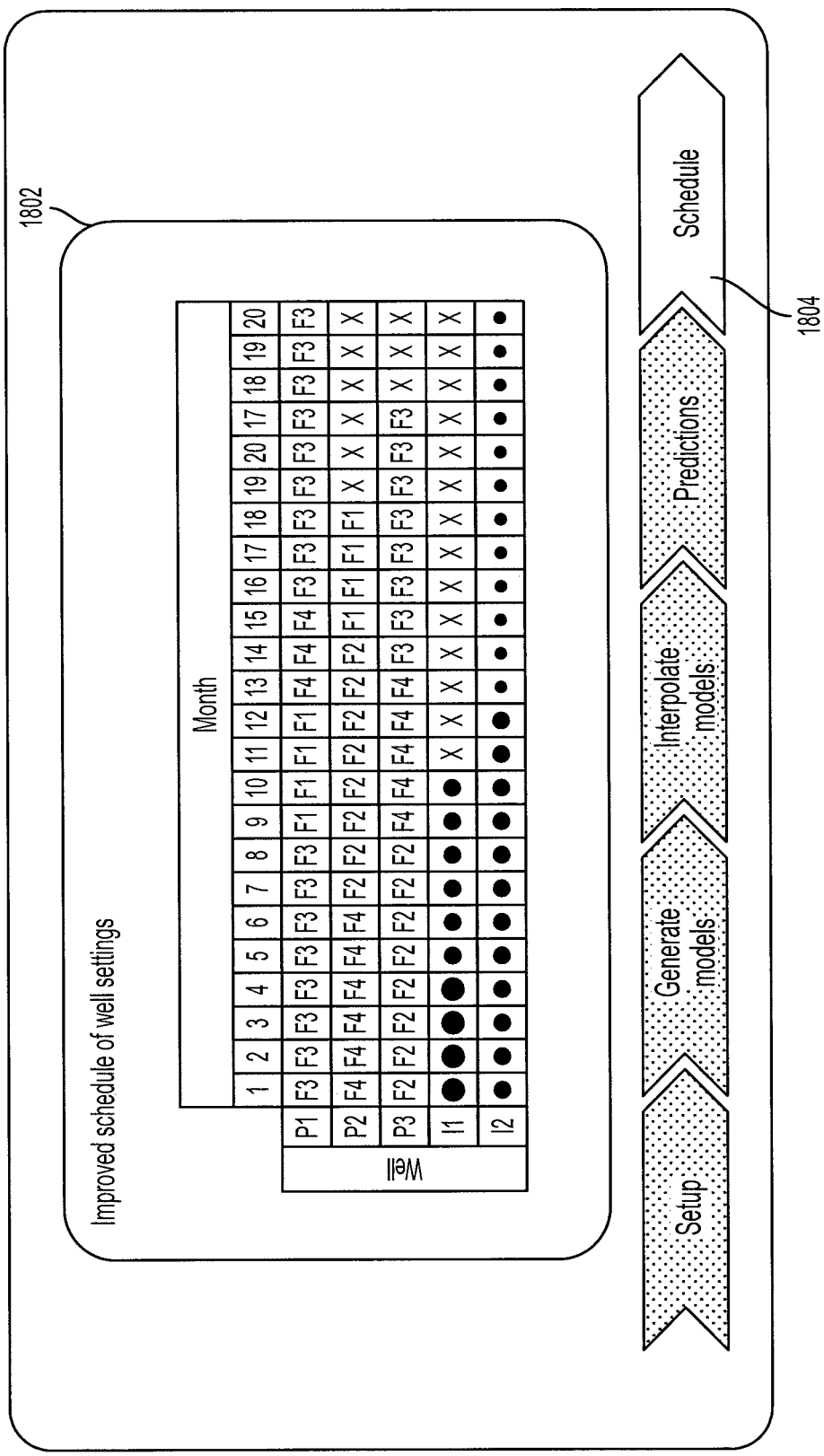

In this example, the prediction and mid-term schedules are based on the next 20 months after the 7 years of history. The well settings are the wellhead choke size at the two injection wells (I1 and I2) and the frequency of electrical pumps at the three production wells (P1, P2 and P3), in all cases are specified in one-month intervals. There are four possible choke sizes and frequencies, and each of the wells can be shut in. The user can proceed with the improvement of the baseline by pressing the corresponding button on the GUI. FIG. 18 shows an example of output GUI in one embodiment, showing improved schedule for mid-term well settings 1802 (e.g., FIG. 1, 115-116). The GUI display shows the 'Schedule' button or process 1804 highlighted to indicate that a mid-term improved schedule of well settings, for example, shown at 115-116 in FIG. 1 has been generated.

Referring to GUI example displays shown in FIG. 6, FIG. 8, FIG. 10, FIG. 12, FIG. 14, FIG. 16, FIG. 17, and FIG. 18, each slide represents in one embodiment, a step in the data assimilation (calibration) workflow for the particular example described above. In the example workflow of the process in one embodiment of the present disclosure as shown by those figures, the user (e.g., a reservoir engineer) may update the mid-term schedule of well settings for a relatively small reservoir to incorporate measurements, in this case, well production data, and an updated economic model. A total of 7 years of production data from each of the three producers is available. The user starts by imputing the relevant information into the system, that is, the production data, an economic model, prior geological models (determined by, e.g., an expert) and parameters: the time sequence for progressive data assimilation (e.g., first year, and then the complete 7 years), the number of models in the batch (e.g., 20), and the number of models in the interpolation stage (e.g., 100). This is shown in FIG. 6. The user then proceeds with the model-generation process. In FIG. 8, FIG. 10, FIG. 12, FIG. 14 and FIG. 16, the model generation and filtering process is shown. Referring to the example, first, 20 data-assimilation processes are launched for 1-year data from which 18 are successful (2 are not successful since the underlying optimization process is stuck in local minima). Second, from these 18 models determined with 1-year data, 18 data-assimilation processes for 7-year data are launched and 15 are successful. Third, the geological-diversity filter discards 3 of these 15 models, and fourth, the performance-measure-diversity filter discards 2 more models of the remaining 12 models. At this point, with 10 accepted models, it is found that the overall stopping criteria are met and no more models are needed (more than one iteration of this process may be performed until enough models are found). The accepted models are then interpolated as shown in FIG. 16, and forecasts for 20 additional months are determined as shown in FIG. 17. The user may then input a baseline schedule and proceed to find an improved schedule in FIG. 18 with the information obtained during the history-matching (calibration) process.

The GUI described above, for example, allows the user to visualize and/or interact with the system of the present disclosure. The system and method of the present disclosure in one embodiment may be fully automated, for example, a hardware processor may perform the functions described above in an autonomous manner, for example, which may include actuating the well settings for hydrocarbon production, with the GUI visualizing the workflow or walkthrough of the process. In another aspect, the GUI may allow the user to control the workflow of the process, for example, by inputting or adjusting input information, and/or controlling the different stages of the process (e.g., start, setup, generate models, interpolate models, prediction, and schedule stages).

Figure 19:
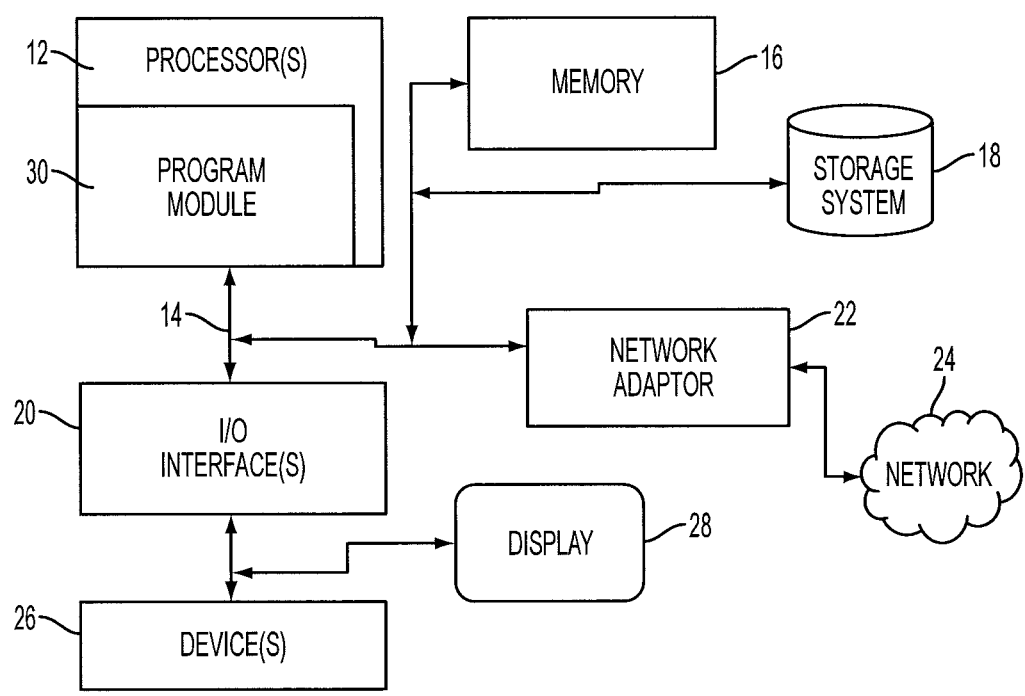
FIG. 19 illustrates a schematic of an example computer or processing system that may implement a well setting system in one embodiment of the present disclosure.

FIG. 19 illustrates a schematic of an example computer or processing system that may implement an oil well setting system in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 19 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a module 30 that performs the methods described herein. The module 30 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

We claim:

1. A method of configuring well settings in mature oil fields, the method executed by at least one hardware processor, the method comprising:
    receiving a set of initial geological reservoir models that generate forecasts of fluid injection and production at a well as a function of time;
    receiving historical well data comprising at least actual fluid injection and production data at the well over time;
    receiving a specification indicating an amount of the historical well data to consider progressively;
    receiving an economic model that comprises mid-term estimation of oil sale price and of production costs;
    generating progressively based on the specification, a plurality of geological reservoir models by fitting the set of initial geological reservoir models with a subset of the historical well data according to the specification to produce a set of intermediary geological reservoir models, and fitting the set of intermediary geological reservoir models to a next subset of the historical well data according to the specification;
    determining from the plurality of geological reservoir models, a set of diverse geological reservoir models;
    generating a mid-term schedule of well settings associated with the well based on the set of diverse geological reservoir models and the economic model; and
    actuating the mid-term schedule of well settings to control the fluid injection and production at the well.

2. The method of claim 1, wherein the determining from the plurality of geological reservoir models, a set of diverse geological reservoir models, comprises:
    filtering the plurality of geological reservoir models by geological diversity, the geological diversity determined based on determining whether parameters of the geological reservoir models are within a tolerance threshold, wherein at least one of the geological reservoir models that has the parameters that are within the tolerance threshold of another one of the geological reservoir models is discarded.

3. The method of claim 1, wherein the determining from the plurality of geological reservoir models, a set of diverse geological reservoir models, comprises:
    filtering the plurality of geological reservoir models by performance metric diversity based on determining that at least one of the geological reservoir models produces a performance metric value that is within a threshold value of a performance metric produced by another one of the geological reservoir models, wherein the at least one of the geological reservoir models is discarded.

4. The method of claim 1, wherein the generating progressively of the plurality of geological reservoir models and the determining of the set of diverse geological reservoir models, are repeated until the set of diverse geological reservoir models produce forecasted values of performance metrics within a defined threshold of previous forecasted values of performance metrics produced by a previous set of diverse geological reservoir models determined in a previous iteration.

5. The method of claim 1, further comprising presenting a sequence of graphical user interface display visualizing a workflow of the method as is being performed by the at least one hardware processor.

6. The method of claim 1, wherein the well settings comprises well head choke size.

7. The method of claim 1, wherein the well settings comprises frequency of electrical pumps.

8. A computer readable storage device storing a program of instructions executable by a machine to perform a method of configuring well settings in mature oil fields, the method comprising:
receiving a set of initial geological reservoir models that generate forecasts of fluid injection and production at a well as a function of time;
receiving historical well data comprising at least actual fluid injection and production data at the well over time;
receiving a specification indicating an amount of the historical well data to consider progressively;
receiving an economic model that comprises mid-term estimation of oil sale price and of production costs;
generating progressively based on the specification, a plurality of geological reservoir models by fitting the set of initial geological reservoir models with a subset of the historical well data according to the specification to produce a set of intermediary geological reservoir models, and fitting the set of intermediary geological reservoir models to a next subset of the historical well data according to the specification;
determining from the plurality of geological reservoir models, a set of diverse geological reservoir models;
generating a mid-term schedule of well settings associated with the well based on the set of diverse geological reservoir models and the economic model; and
actuating the mid-term schedule of well settings to control the fluid injection and production at the well.

9. The computer readable storage device of claim 8, wherein the determining from the plurality of geological reservoir models, a set of diverse geological reservoir models, comprises:
filtering the plurality of geological reservoir models by geological diversity, the geological diversity determined based on determining whether parameters of the geological reservoir models are within a tolerance threshold, wherein at least one of the geological reservoir models that has the parameters that are within the tolerance threshold of another one of the geological reservoir models is discarded.

10. The computer readable storage device of claim 8, wherein the determining from the plurality of geological reservoir models, a set of diverse geological reservoir models, comprises:
filtering the plurality of geological reservoir models by performance metric diversity based on determining that at least one of the geological reservoir models produces a performance metric value within a threshold value of a performance metric produced by another one of the geological reservoir models, wherein the at least one of the geological reservoir models is discarded.

11. The computer readable storage device of claim 8, wherein the generating progressively of the plurality of geological reservoir models and the determining of the set of diverse geological reservoir models, are repeated until the set of diverse geological reservoir models produce forecasted values of performance metrics within a defined threshold of previous forecasted values of performance metrics produced by a previous set of diverse geological reservoir models determined in a previous iteration.

12. The computer readable storage device of claim 8, further comprising presenting a sequence of graphical user interface display visualizing a workflow of the method as is being performed by the at least one hardware processor.

13. The computer readable storage device of claim 8, wherein the well settings comprises well head choke size.

14. The computer readable storage device of claim 8, wherein the well settings comprises frequency of electrical pumps.

15. A system of configuring well settings in mature oil fields, comprising:
at least one hardware processor; and
a display device operatively coupled to the hardware processor;
the hardware processor receiving a set of initial geological reservoir models that generate forecasts of fluid injection and production at a well as a function of time;
the hardware processor receiving historical well data comprising at least actual fluid injection and production data at the well over time;
the hardware processor receiving a specification indicating an amount of the historical well data to consider progressively;
the hardware processor receiving an economic model that comprises mid-term estimation of oil sale price and of production costs;
the hardware processor generating progressively based on the specification, a plurality of geological reservoir models by fitting the set of initial geological reservoir models with a subset of the historical well data according to the specification to produce a set of intermediary geological reservoir models, and fitting the set of intermediary geological reservoir models to a next subset of the historical well data according to the specification;
the hardware processor determining from the plurality of geological reservoir models, a set of diverse geological reservoir models;
the hardware processor generating a mid-term schedule of well settings associated with the well based on the set of diverse geological reservoir models and the economic model;
the hardware processor actuating the mid-term schedule of well settings to control the fluid injection and production at the well.

16. The system of claim 15, wherein the hardware processor determines the set of diverse geological reservoir models by filtering the plurality of geological reservoir models by geological diversity, the geological diversity determined based on determining whether parameters of the geological reservoir models are within a tolerance threshold, wherein at least one of the geological reservoir models that has the parameters that are within the tolerance threshold of another one of the geological reservoir models is discarded.

17. The system of claim 15, wherein the hardware processor determines the set of diverse geological reservoir models by filtering the plurality of geological reservoir models by performance metric diversity based on determining that at least one of the geological reservoir models produces a performance metric value that is within a threshold valued of a performance metric produced by another one of the geological reservoir models, wherein the at least one of the geological reservoir models is discarded.

18. The system of claim 15, wherein the hardware processor repeats the generating progressively of the plurality of geological reservoir models and the determining of the set of diverse geological reservoir models, until the set of diverse geological reservoir models produce forecasted values of performance metrics within a defined threshold of previous forecasted values of performance metrics produced by a previous set of diverse geological reservoir models determined in a previous iteration.

19. The system of claim 15, wherein the hardware processor further presents a sequence of graphical user interface display on the display device that visualizes a workflow of configuring the well settings as executed by the hardware processor.

20. The system of claim 15, wherein the well settings comprises at least one of well head choke size and frequency of electrical pumps.

* * * * *